(12) United States Patent
Hiew et al.

(10) Patent No.: US 8,240,034 B1
(45) Date of Patent: Aug. 14, 2012

(54) HIGH THROUGHPUT MANUFACTURING METHOD FOR MICRO FLASH MEMORY CARDS

(75) Inventors: Siew S. Hiew, San Jose, CA (US);
Frank I-Kang Yu, Palo Alto, CA (US);
David Q. Chow, San Jose, CA (US);
Jim Chin-Nan Ni, San Jose, CA (US);
Nan Nan, San Jose, CA (US); Abraham C. Ma, Fremont, CA (US);
Ming-Shiang Shen, Taipei (TW)

(73) Assignee: Super Talent Electronics, Inc., San Jose, CA (US)

( * ) Notice: Subject to any disclaimer, the term of this patent is extended or adjusted under 35 U.S.C. 154(b) by 1113 days.

(21) Appl. No.: 12/128,502

(22) Filed: May 28, 2008

Related U.S. Application Data

(60) Continuation-in-part of application No. 12/116,715, filed on May 7, 2008, now abandoned, and a continuation-in-part of application No. 10/888,282, filed on Jul. 8, 2004, now Pat. No. 7,941,916, and a continuation-in-part of application No. 11/309,594, filed on Aug. 28, 2006, now Pat. No. 7,383,362, which is a continuation-in-part of application No. 10/707,277, filed on Dec. 2, 2003, now Pat. No. 7,103,684, which is a continuation-in-part of application No. 12/025,706, filed on Feb. 4, 2008, now Pat. No. 7,886,108, and a continuation-in-part of application No. 12/099,421, filed on Apr. 8, 2008, now Pat. No. 7,984,303, and a continuation-in-part of application No. 11/624,667, filed on Jan. 18, 2007, now abandoned, which is a division of application No. 09/478,720, filed on Jan. 6, 2000, now Pat. No. 7,257,714.

(51) Int. Cl.
*H05K 3/30* (2006.01)

(52) U.S. Cl. .............. 29/841; 29/412; 29/834; 438/108; 438/113

(58) Field of Classification Search ............... 29/710, 29/832–834, 841, 412, 415, 417; 438/108, 438/112, 113; 235/375
See application file for complete search history.

(56) References Cited

U.S. PATENT DOCUMENTS

| | | | |
|---|---|---|---|
| 5,623,552 | A | 4/1997 | Lane |
| 5,907,856 | A | 5/1999 | Estakhri et al. |
| 5,959,541 | A | 9/1999 | DiMaria et al. |
| 6,000,006 | A | 12/1999 | Bruce et al. |
| 6,012,636 | A | 1/2000 | Smith |

(Continued)

*Primary Examiner* — Donghai D. Nguyen
(74) *Attorney, Agent, or Firm* — Blakely Sokoloff Taylor & Zafman LLP

(57) ABSTRACT

According to certain embodiments of the invention, a flash memory card is manufactured using COB processes on a PCB panel with multiple micro cards PCB substrates. These micro memory cards are laid out in an array of 3×5 matrixes of micro cards PCB substrates. A method of molding over a PCBA is utilized, contrary to a conventional method of having two or more pieces of package components to tape together. This results in a simpler structure without the notch which enables easier singulation process and the package is moisture resistance. The final product is a single piece versus two or three pieces glued up pieces and would not separate from pieces. The final product has high water and moisture resistance, low cost and fast manufacturing throughput, no seam and aesthetically more appeasing, can stack more layers of flash memory die, and be maximized XY spaces to accommodate larger size flash memory die.

9 Claims, 49 Drawing Sheets

Process Flow

U.S. PATENT DOCUMENTS

| | | |
|---|---|---|
| 6,069,920 A | 5/2000 | Schulz et al. |
| 6,081,858 A | 6/2000 | Abudayyeh et al. |
| 6,125,192 A | 9/2000 | Bjorn et al. |
| 6,193,152 B1 | 2/2001 | Fernando et al. |
| 6,202,138 B1 | 3/2001 | Estakhri et al. |
| 6,230,233 B1 | 5/2001 | Lofgren et al. |
| 6,275,894 B1 | 8/2001 | Kuo et al. |
| 6,321,478 B1 | 11/2001 | Klebes |
| 6,444,501 B1 * | 9/2002 | Bolken ................ 438/112 |
| 6,547,130 B1 | 4/2003 | Shen |
| 6,555,400 B2 * | 4/2003 | Farnworth et al. ........ 29/710 |
| 6,636,929 B1 | 10/2003 | Frantz et al. |
| 6,718,407 B2 | 4/2004 | Martwick |
| 6,880,024 B2 | 4/2005 | Chen et al. |
| 6,945,466 B2 * | 9/2005 | Sanemitsu ............... 235/375 |
| 7,103,684 B2 | 9/2006 | Chen et al. |
| 7,103,765 B2 | 9/2006 | Chen |
| 7,249,978 B1 | 7/2007 | Ni |
| 7,257,714 B1 | 8/2007 | Shen |
| 7,264,992 B2 | 9/2007 | Hsueh et al. |
| 2001/0043174 A1 | 11/2001 | Jacobsen et al. |
| 2002/0166023 A1 | 11/2002 | Nolan et al. |
| 2003/0046510 A1 | 3/2003 | North |
| 2003/0163656 A1 | 8/2003 | Ganton |
| 2004/0148482 A1 | 7/2004 | Grundy et al. |
| 2004/0255054 A1 | 12/2004 | Pua et al. |
| 2005/0102444 A1 | 5/2005 | Cruz |
| 2005/0160213 A1 | 7/2005 | Chen |
| 2005/0193161 A1 | 9/2005 | Lee et al. |
| 2005/0246243 A1 | 11/2005 | Adams et al. |
| 2005/0268082 A1 | 12/2005 | Poisner |
| 2006/0065743 A1 | 3/2006 | Fruhauf |
| 2006/0075174 A1 | 4/2006 | Vuong |
| 2006/0106962 A1 | 5/2006 | Woodbridge et al. |
| 2006/0161725 A1 | 7/2006 | Lee et al. |
| 2006/0206702 A1 | 9/2006 | Fausak |
| 2006/0242395 A1 | 10/2006 | Fausak |
| 2007/0079043 A1 | 4/2007 | Yu et al. |
| 2007/0094489 A1 | 4/2007 | Ota et al. |
| 2007/0113067 A1 | 5/2007 | Oh et al. |
| 2007/0113267 A1 | 5/2007 | Iwanski et al. |
| 2007/0130436 A1 | 6/2007 | Shen |

* cited by examiner

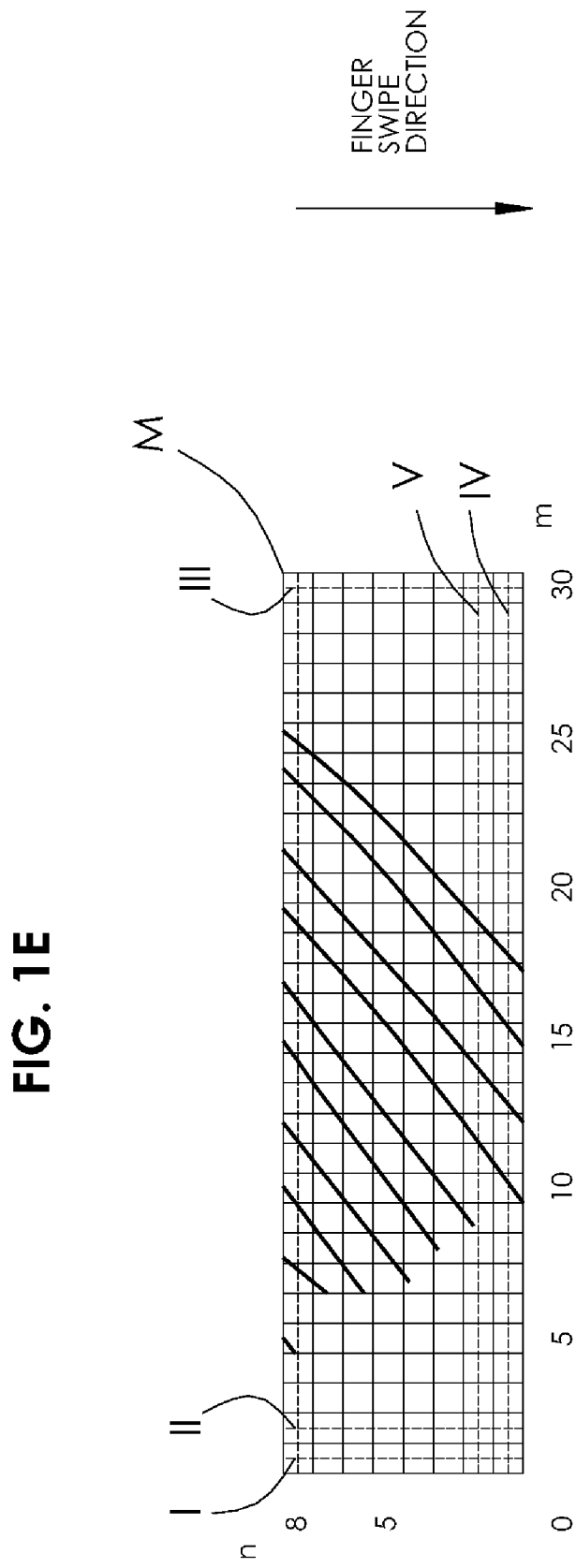

Data structure of PLTPPUI in Reserved Area of MLC Flash Memory 420

Old physical block (PBK#1000) for storing PLTPPUI0 422

| | | | | |
|---|---|---|---|---|
| 1st Write (P0) 424a | Entry 0 | Entry 1 | ... | FF | Special Logical Address for PLTPPUI0 | 1 |
| 2nd Write (P1) 424b | Entry 0 | Entry 1 | | | |
| ... | | | | | |
| nth Write (Pn) 424n | Entry 0 | Entry 1 | ... | | |

New physical block (PBK#1012) for storing PLTPPUI0 432

| | | | | |
|---|---|---|---|---|
| (n+1)th Write (P0) 434 | Entry 0 | Entry 1 | ... | FF | Special Logical Address for PLTPPUI0 | 2 |
| | | | | | | |

*FIG. 4C*

Data Structure of the PLTPPUI Tracking Table 440

| | Physical Block Number 444 | Tracking No. (TN) 446 | Highest Page 448 |
|---|---|---|---|
| Special Logical Address for PLTPPUI0 | 1012 | 0 | 0 |
| Special Logical Address for PLTPPUI1 | 1018 | 5 | 1 |
| ⋮ | | | |
| Special Logical Address for PLTPPUIN | 1005 | 4 | 0 |

Data Structure of the WL/BB Tracking Table 450

| | Physical Block Number 454 | Tracking No. (TN) 456 | Highest Page 458 |
|---|---|---|---|
| Special Logical Address for WL/BB0 | 1023 | 1 | 5 |
| Special Logical Address for WL/BB1 | 1020 | 0 | 3 |
| ⋮ (452) | | | |
| Special Logical Address for WL/BBn | 1021 | 3 | 7 |

*FIG. 4E*

Data Structure of the WL/BB Tracking Table in Reserved Area of Flash Memory 460

|  |  |  |  |  | 467 |  | 452 |  | 456 |
|---|---|---|---|---|---|---|---|---|---|
| 1st Write (P0) | BK0 (Reserved) | BK1 WL |  |  | BK7 BB FFFF FFEE |  | F F | Special Logical Address for WL/BB1 | 1 |
| 2nd Write (P1) |  | BK1 WL old | BK3 WL new |  |  |  |  |  |  |
| 3rd Write (P2) |  | BK1 WL old | BK3 WL old | BK5 WL new |  |  |  |  |  |
| ⋮ |  |  |  |  |  |  |  |  |  |
| nth Write (Pn) |  |  |  |  |  |  |  |  |  |

| 1st Write (P0) | BK1000 WL new |  | BK1003 BB |  |  |  | F F | Special Logical Address for WL/BB2 | 1 |
|---|---|---|---|---|---|---|---|---|---|
| 2nd Write (P1) | BK1000 WL old |  |  | BK1021 WL new |  |  |  |  |  |
| ⋮ |  |  |  |  |  |  |  |  |  |
| nth Write (Pn) |  |  |  |  |  |  |  |  |  |

*FIG. 4F*

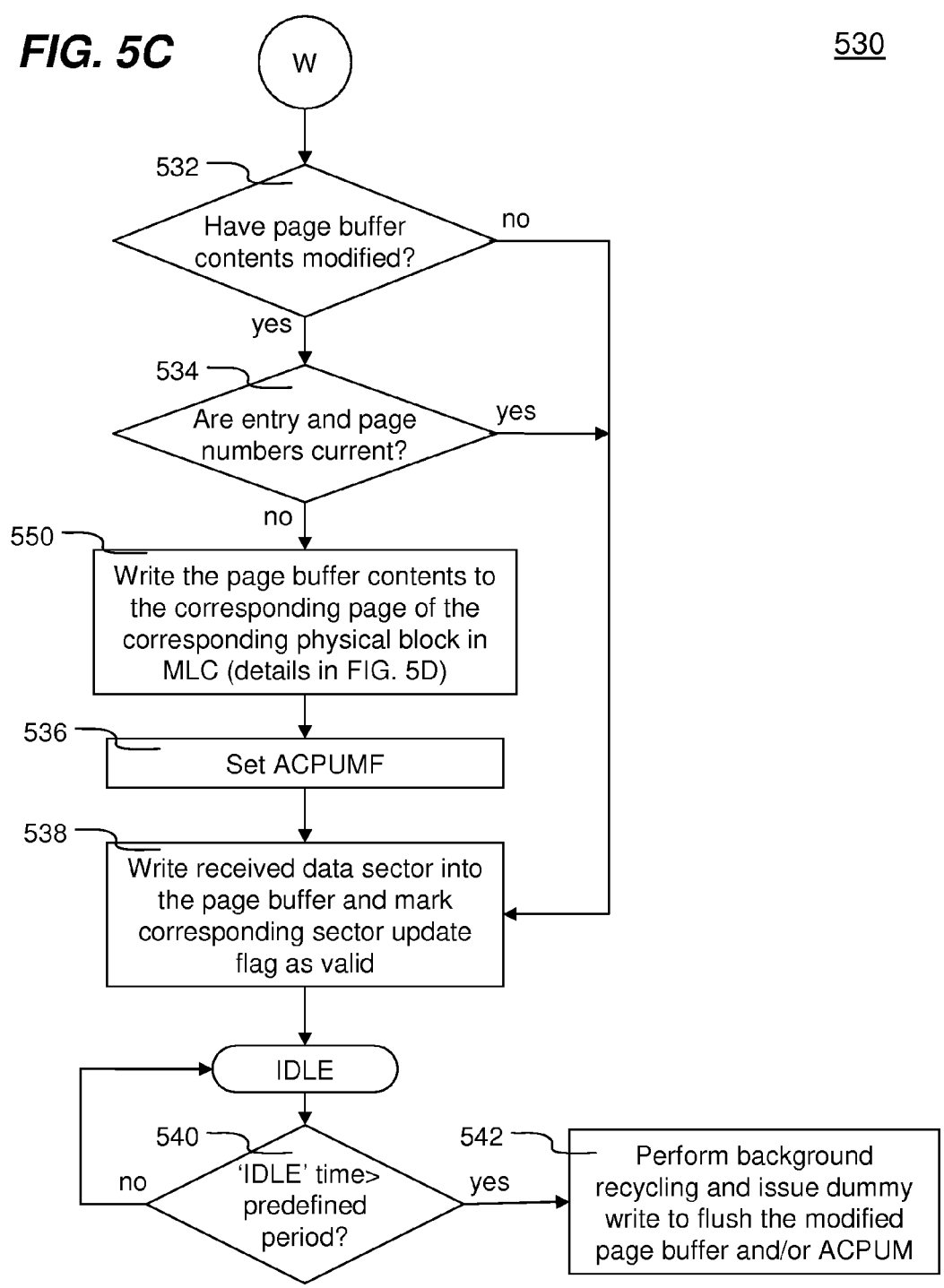

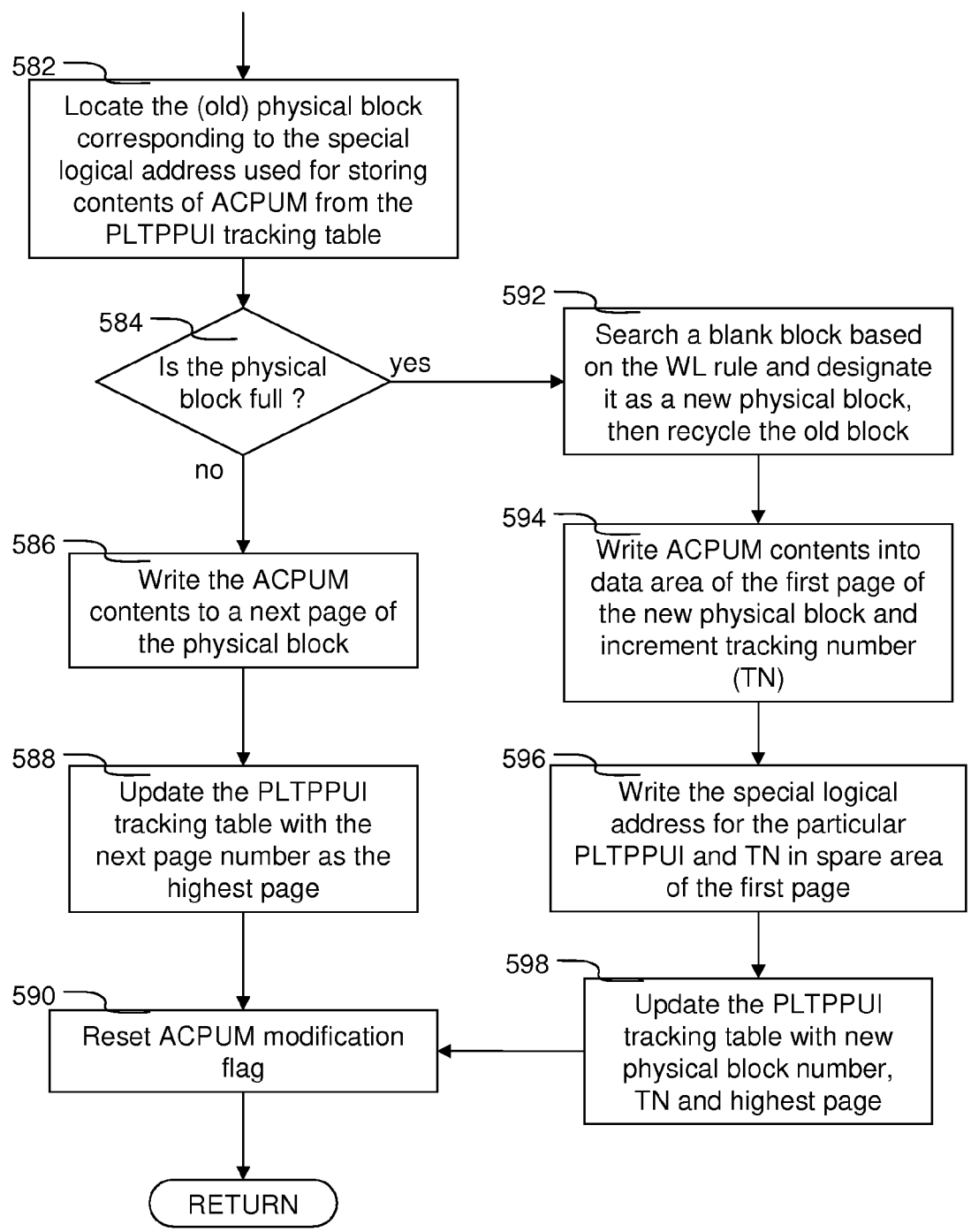

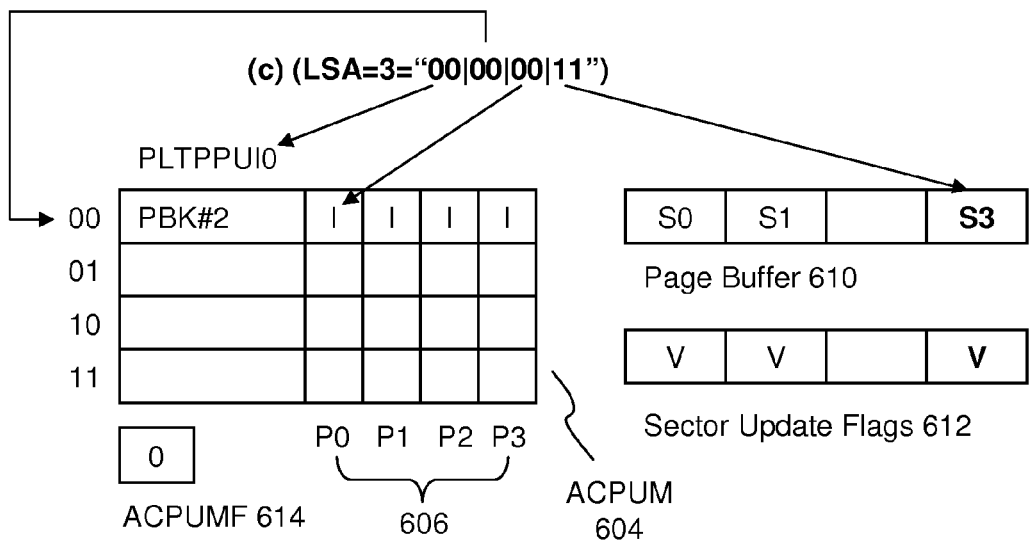
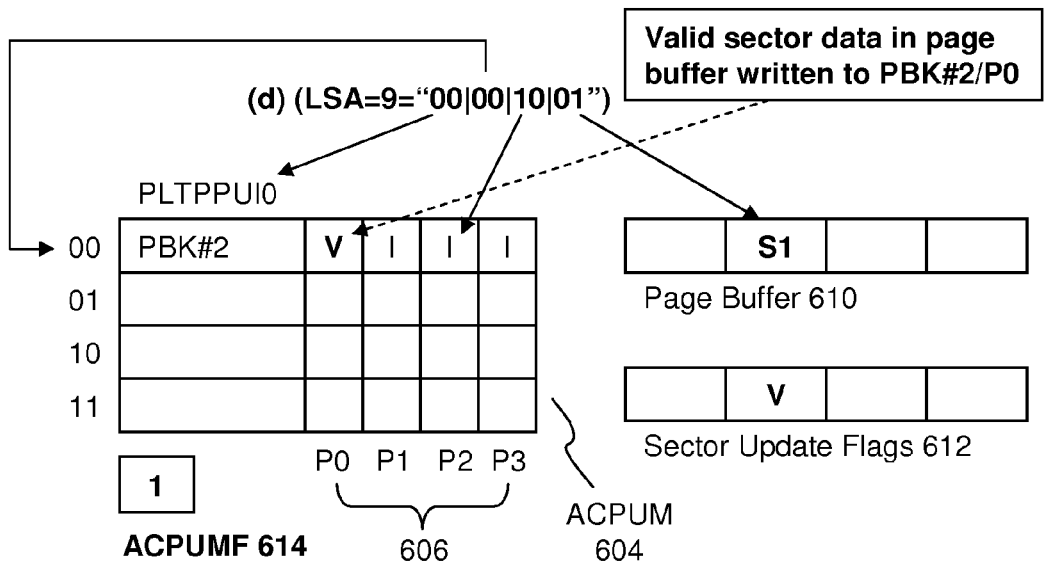
FIG. 6B

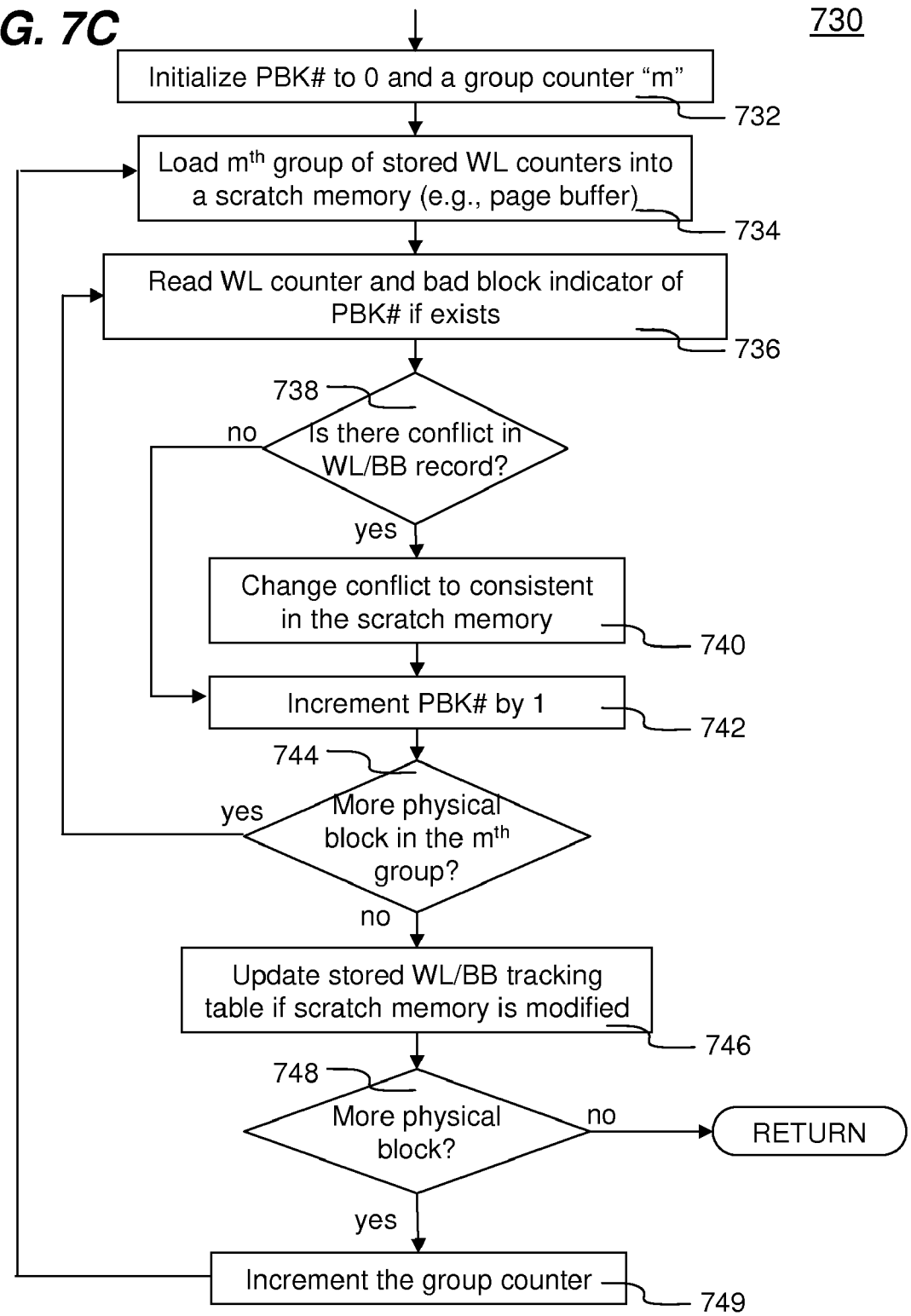

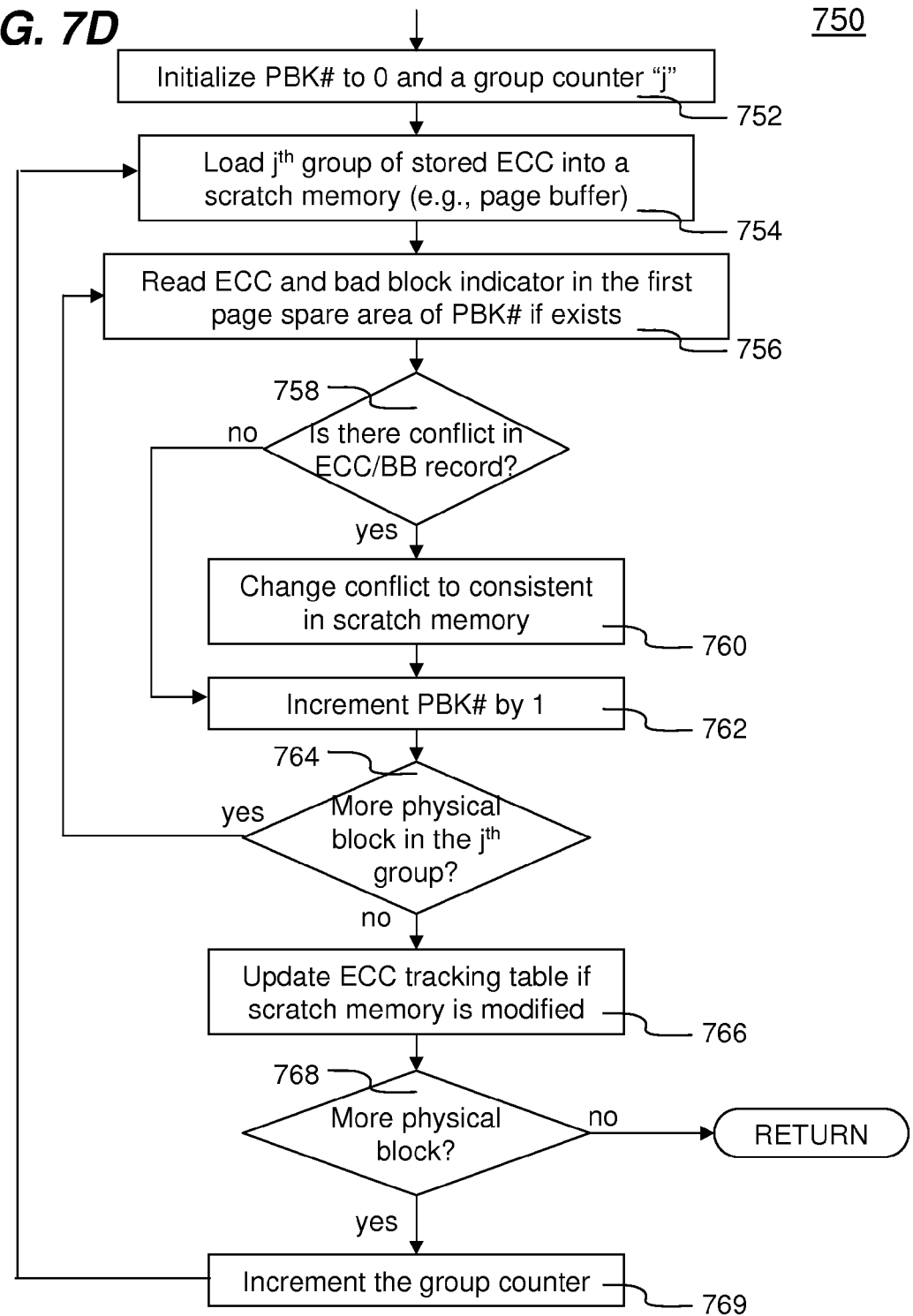

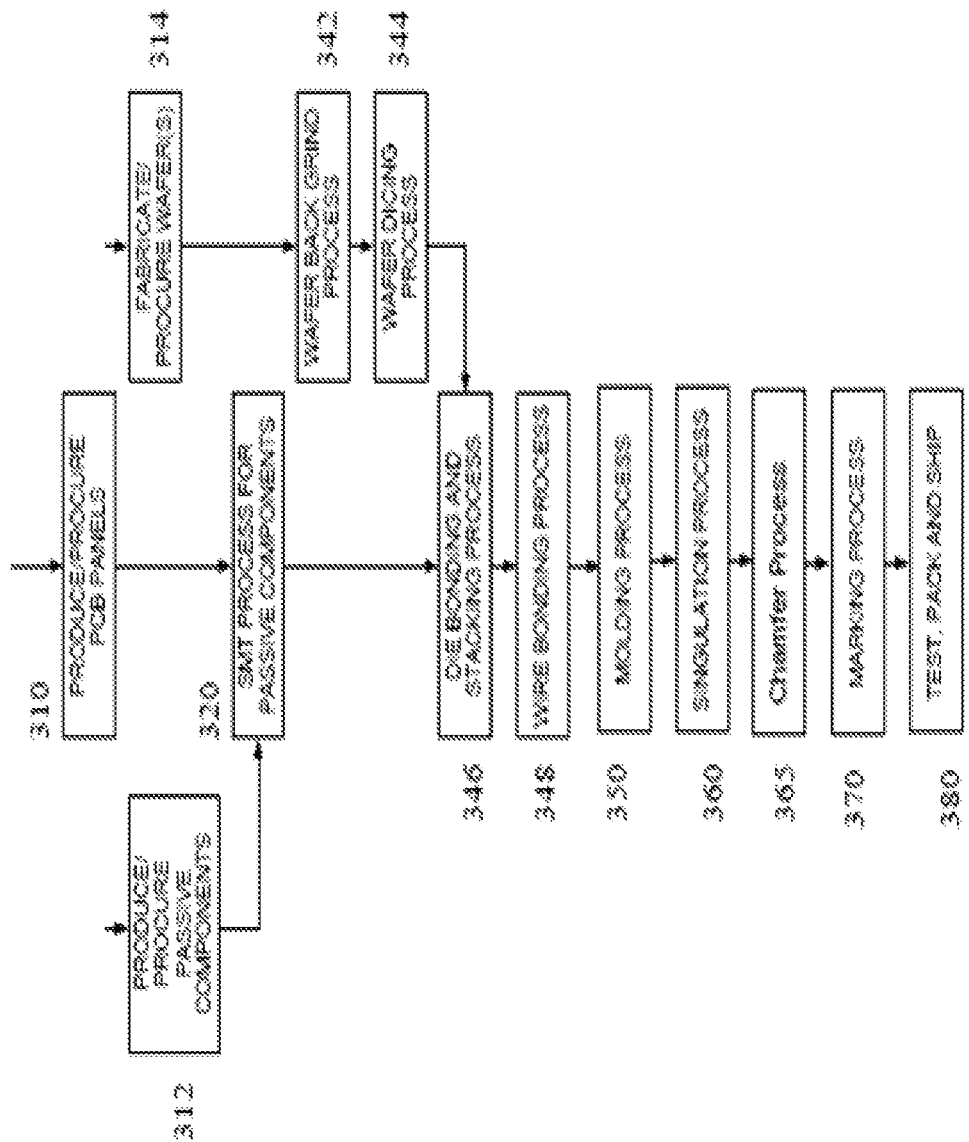
FIG. 8 Process Flow

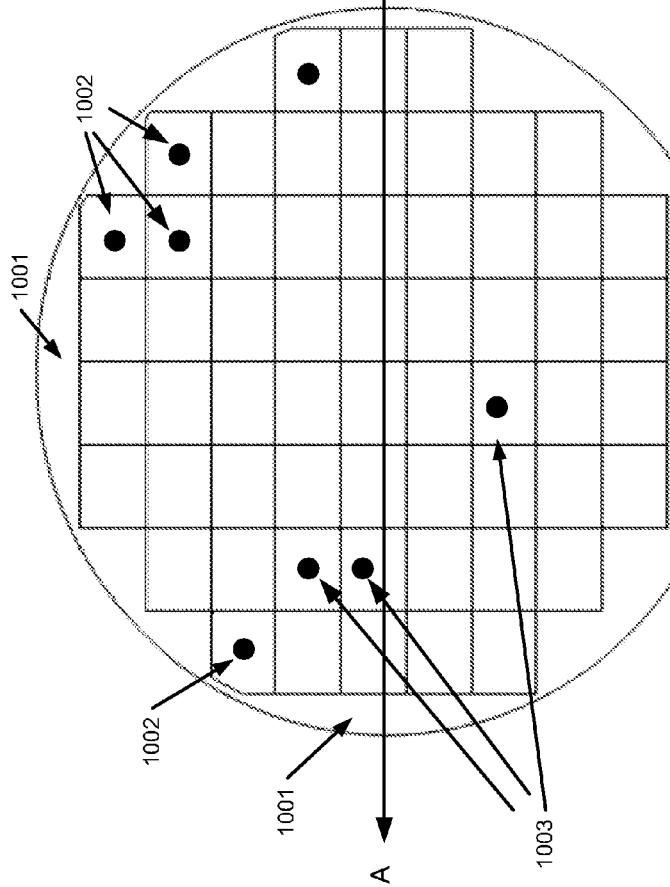
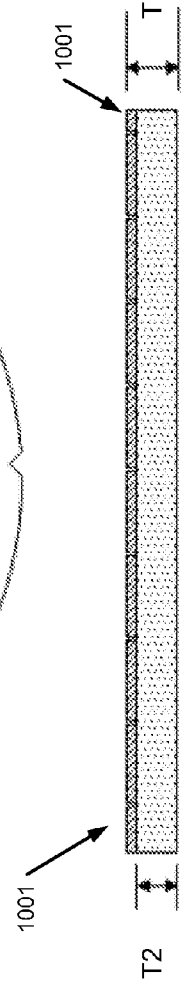
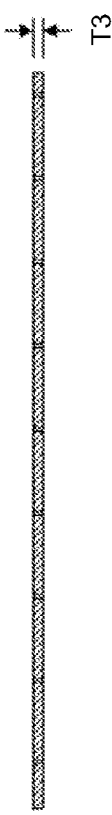
FIG. 10A
FIG. 10B
FIG. 10C

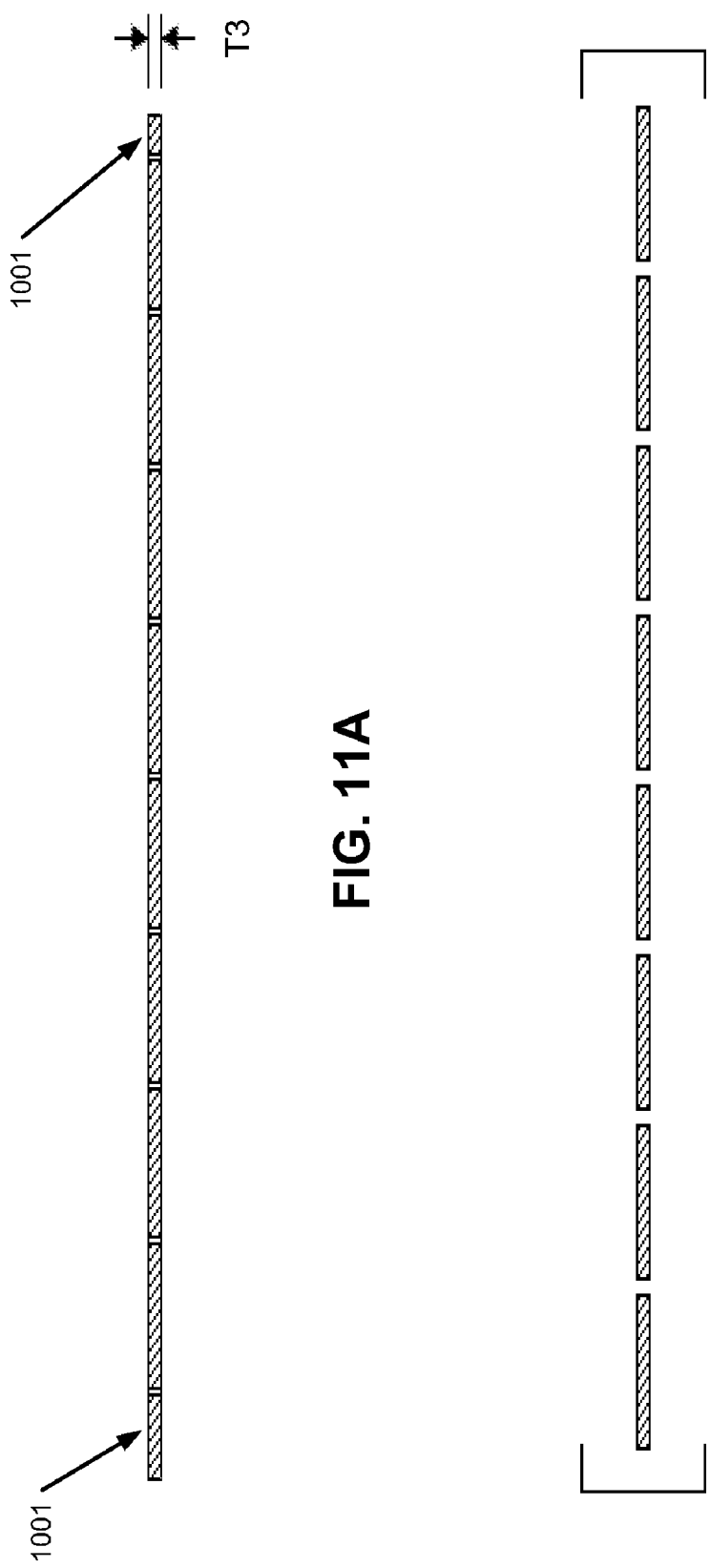

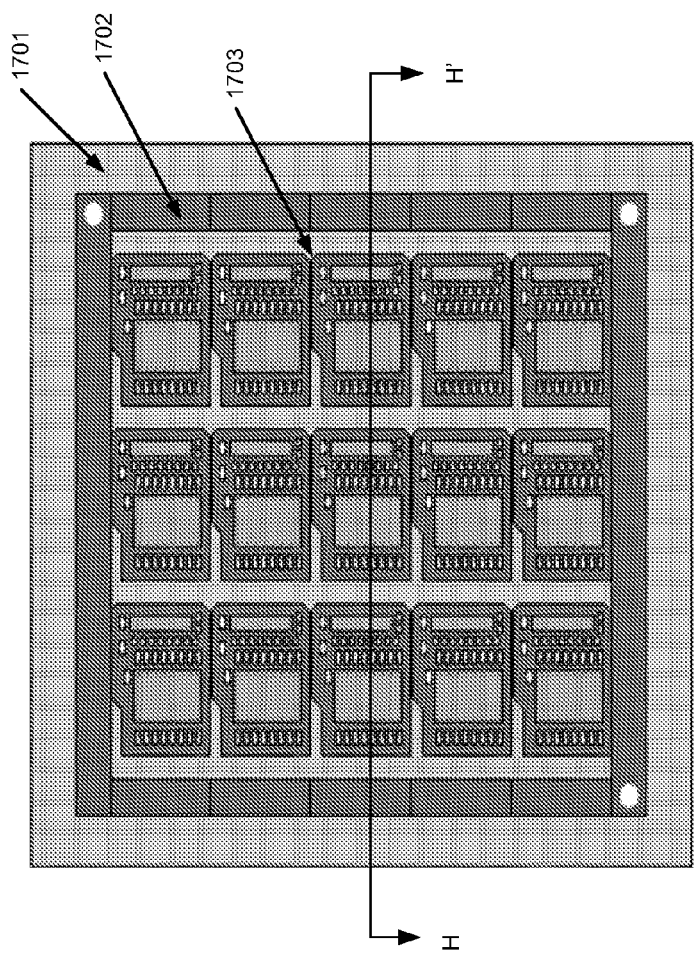
FIG. 17A
FIG. 17B

HIGH THROUGHPUT MANUFACTURING METHOD FOR MICRO FLASH MEMORY CARDS

CROSS-REFERENCE TO RELATED APPLICATIONS

This application is a continuation-in-part (CIP) of co-pending U.S. patent application for "One Shot Molding For Flash Cards Assembly Process", U.S. application Ser. No. 12/116,715 filed May 7, 2008.

This application is also a CIP of U.S. patent application for "Manufacturing Method For Memory Card", U.S. application Ser. No. 10/888,282 filed Jul. 8, 2004.

This application is also a CIP of U.S. patent application for "Single-Chip Multi-Media Card/Secure Digital (MMC/SD) Controller Reading Power-on Boot Code from Integrated Flash Memory for User Storage", U.S. application Ser. No. 11/309,594 filed Aug. 28, 2006, which is a CIP of "Single-Chip USB Controller Reading Power-On Boot Code from Integrated Flash Memory for User Storage", U.S. application Ser. No. 10/707,277, filed Dec. 2, 2003, now U.S. Pat. No. 7,103,684.

This application is also a CIP of U.S. patent application for "Methods and Systems of Managing Memory Addresses in a Large Capacity Multi-Level Cell (MLC) Based Flash Memory Device", U.S. application Ser. No. 12/025,706 filed Feb. 4, 2008.

This application is also a CIP of U.S. patent application for "Flash Memory Devices with Security Features", U.S. application Ser. No. 12/099,421, filed Apr. 8, 2008.

This application is also a CIP of U.S. patent Application for "Electronic Data Storage Medium with Fingerprint Verification Capability", Ser. No. 11/624,667, filed on Jan. 18, 2007, which is a divisional application of U.S. patent application Ser. No. 09/478,720, filed on Jan. 6, 2000, now U.S. Pat. No. 7,257,714.

The disclosure of the above-identified U.S. patent applications and patents is incorporated herein in its entirety.

FIELD OF THE INVENTION

The invention relates to flash memory devices, more particularly to a molding process for assembling multi-level cell (MLC) based flash memory devices.

BACKGROUND OF THE INVENTION

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity.

A conventional method of manufacturing micro flash memory cards is to use either pre-molded one sided or two sided package with large enough cavity to hold the rectangular micro flash memory card block by gluing to the package's cavity. The package can fall apart as the adhesive quality degraded.

The conventional method has limitation as most of the corner spaces are defined in the pre-molded plastic package which can be used to house the controller die in the present invention. In addition, the package has a certain thickness to form the cavity for the micro flash memory card block. This package thickness can be utilized in this invention to stack and additional one to two layers of flash memory dies. The adhesion between the micro flash memory card flash memory block and the cavity of the molded package can be unreliable at time that allows the micro flash memory cards micro flash memory block to fall out of the package cavity. There is a seam around the edges of the micro flash memory block. The surface on the package side is not smooth as compare to this invention due to the thin wall and the glue impression that created from the cavity and the micro flash memory block.

BRIEF SUMMARY OF THE INVENTION

According to certain embodiments of the invention, a flash memory card is manufactured using chip-on-board (COB) processes on a PCB panel with multiple micro cards PCB substrates. These micro memory cards are laid out in an array of 3×5 matrixes of micro cards PCB substrates. A method of molding over a PCBA is utilized, contrary to a conventional method of having two or more pieces of package components to tape together. This results in a simpler structure without the notch which enables easier singulation process and the package is moisture resistance.

The final product is a single piece versus two or three pieces glued up pieces and would not separate from pieces. The final product has high water and moisture resistance, low cost and fast manufacturing throughput, no seam and aesthetically more appeasing, can stack more layers of flash memory die, and be maximized XY spaces to accommodate larger size flash memory die.

BRIEF DESCRIPTION OF THE DRAWINGS

These and other features, aspects, and advantages of the present invention will be better understood with regard to the following description, appended claims, and accompanying drawings as follows:

FIGS. 1D-1H are diagrams illustrating scanning lines of a fingerprint from an "Area" fingerprint sensor.

FIGS. 4A-4F collectively show exemplary data structures used for managing memory addresses of the flash memory of FIG. 2A in accordance with one embodiment of the present invention;

FIGS. 5A-5E collectively show a flow chart of an exemplary process of conducting data transfer requests of the flash memory of FIG. 2A in accordance with one embodiment of the present invention;

FIGS. 6A-6E collectively show a sequence of data write requests to demonstrate the exemplary process 500 of FIGS. 5A-5E;

FIGS. 7A-7E collectively are a flowchart illustrating an exemplary process of initialization of a large capacity flash memory device in accordance with one embodiment of the present invention;

FIG. 8 is a flow diagram for manufacturing a memory device according to one embodiment;

FIGS. 10A-10C and 11A-11B show a PCB panel in different views as part of a wafer back grinding process according to one embodiment of the invention.

FIGS. 17A-17B and 18A-18B show a PCB panel in different views as part of a molding process according to one embodiment of the invention.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "front", "back", "rear", "side", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-8I. However, those skilled in the art will readily appreciate that the detailed description given herein with respect to these figures is for explanatory purposes as the invention extends beyond these limited embodiments.

Figure 1A:
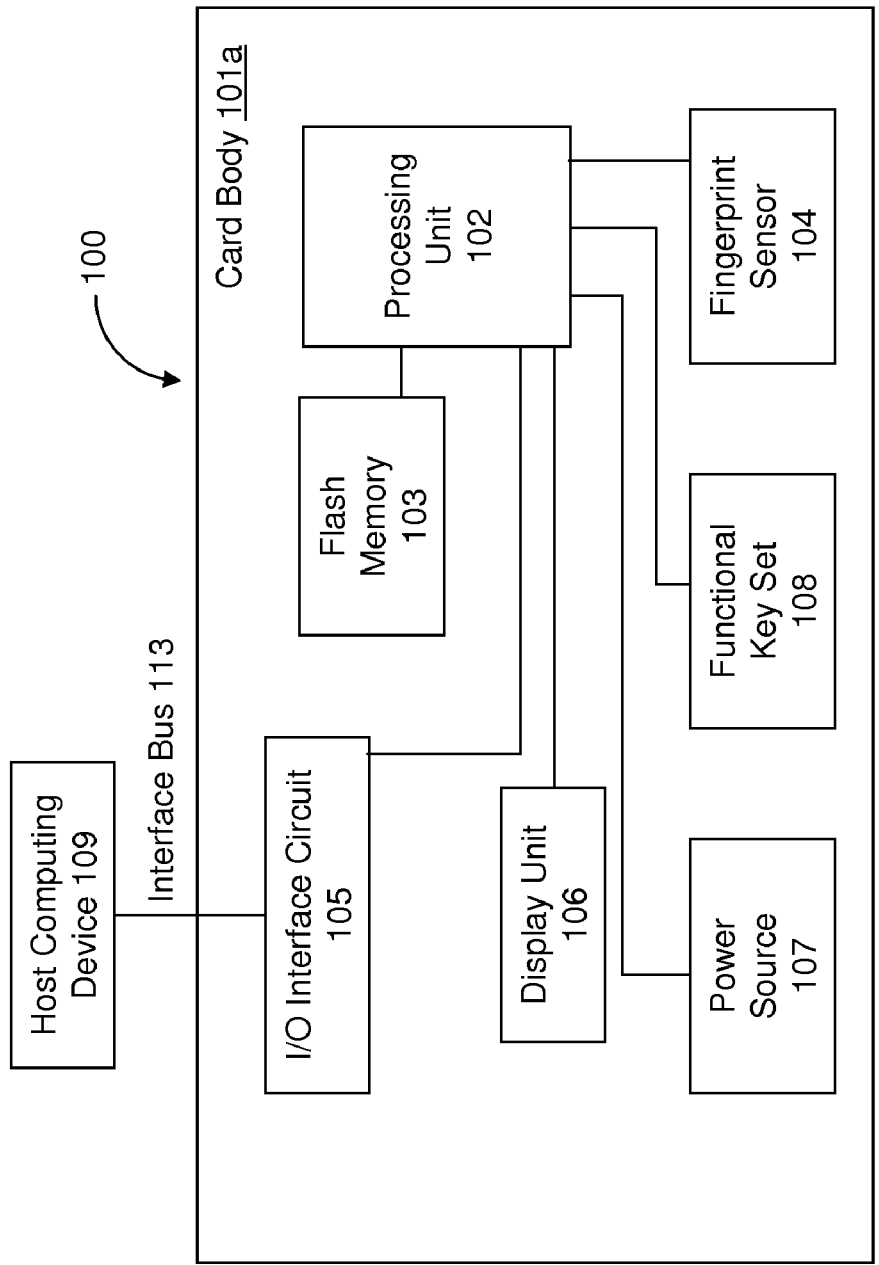
FIGS. 1A-1C are block diagrams showing three electronic environments, in which one embodiment of the present invention may be implemented in three respective exemplary electronic flash memory devices.
Figure 1B:
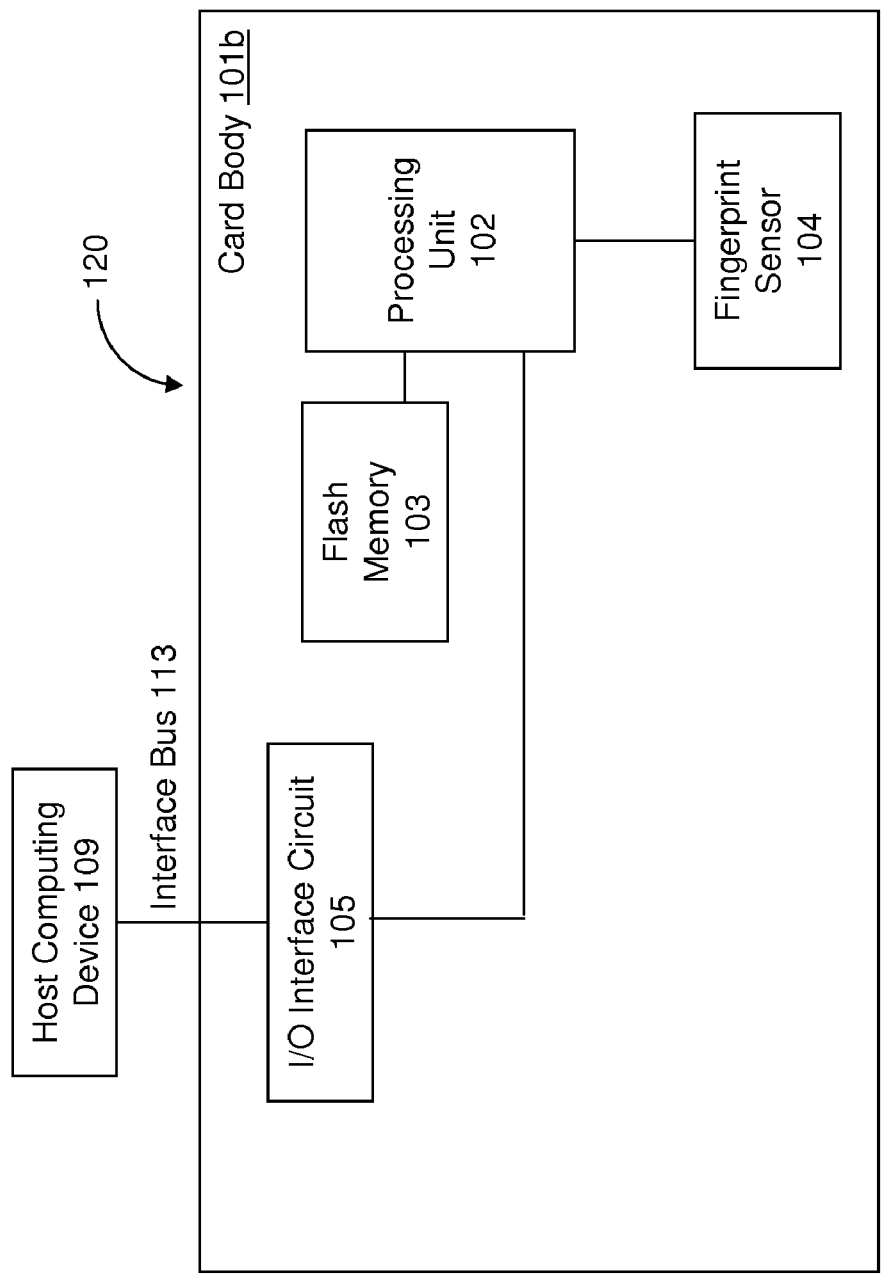
Figure 1C:
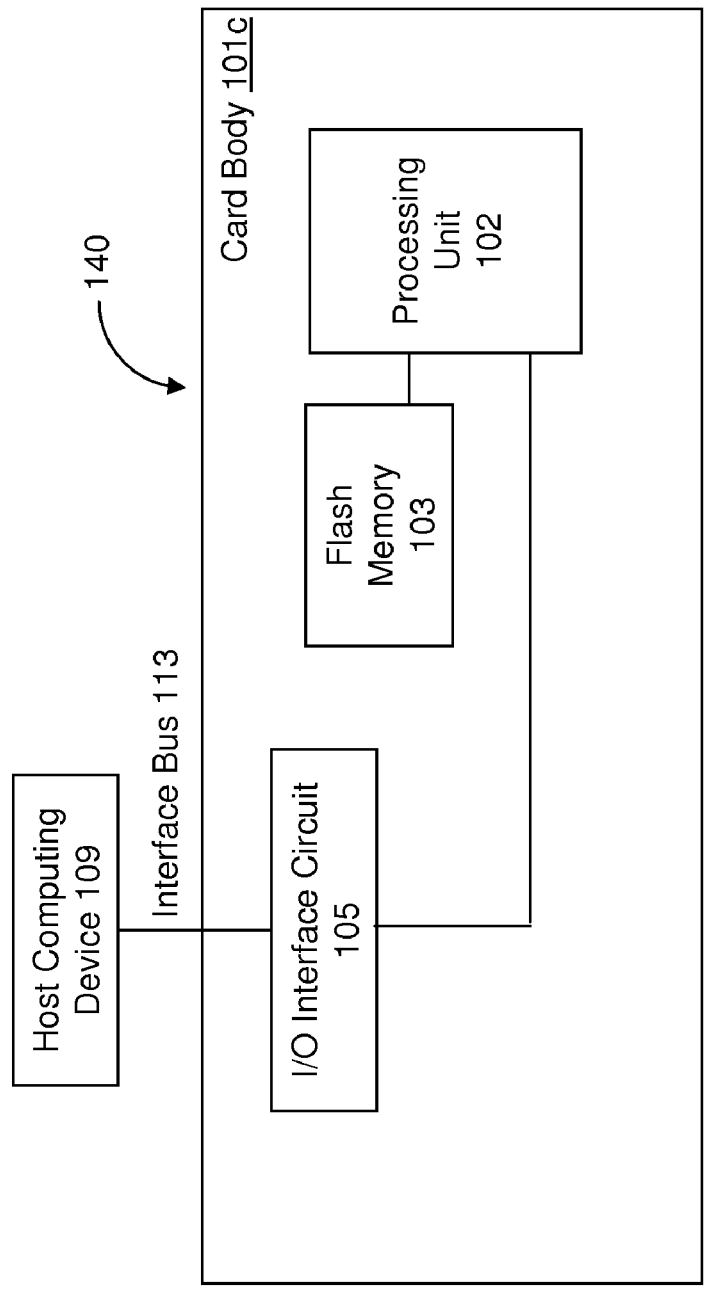

FIGS. 1A-1C are block diagrams illustrating three electronic environments, in which one embodiment of the present invention may be deployed in three respective exemplary electronic flash memory devices. Shown in FIG. 1A is a first electronic environment. A first flash memory device 100 is adapted to be accessed by a host computing device 109 via an interface bus 113. The first flash memory device 100 includes a card body 101a, a processing unit 102, at least one flash memory module 103, a fingerprint sensor 104, an input/output (I/O) interface circuit 105, an optional display unit 106, an optional power source (e.g., battery) 107, and an optional function key set 108. The host computing device 109 may include, but not be limited to, a desktop computer, a laptop computer, a mother board of a personal computer, a cellular phone, a digital camera, a digital camcorder, a personal multimedia player.

The card body 101a is configured for providing electrical and mechanical connection for the processing unit 102, the flash memory module 103, the I/O interface circuit 105, and all of the optional components. The card body 101a may comprise a printed circuit board (PCB) or an equivalent substrate such that all of the components as integrated circuits may be mounted thereon. The substrate may be manufactured using surface mount technology (SMT) or chip on board (COB) technology.

The processing unit 102 and the I/O interface circuit 105 are collectively configured to provide various control functions (e.g., data read, write and erase transactions) of the flash memory module 103. The processing unit 102 may also be a standalone microprocessor or microcontroller, for example, an 8051, 8052, or 80286 Intel® microprocessor, or ARM®, MIPS® or other equivalent digital signal processor. The processing unit 102 and the I/O interface circuit 105 may be made in a single integrated circuit, for application specific integrated circuit (ASIC).

The at least one flash memory module 103 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof.

The fingerprint sensor 104 is mounted on the card body 101a, and is adapted to scan a fingerprint of a user of the first electronic flash memory device 100 to generate fingerprint scan data. Details of the fingerprint sensor 104 are shown and described in a co-inventor's U.S. Pat. No. 7,257,714, entitled "Electronic Data Storage Medium with Fingerprint Verification Capability" issued on Aug. 14, 2007, the entire content of which is incorporated herein by reference.

The flash memory module 103 stores, in a known manner therein, one or more data files, a reference password, and the fingerprint reference data obtained by scanning a fingerprint of one or more authorized users of the first flash memory device. Only authorized users can access the stored data files. The data file can be a picture file, a text file or any other file. Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

The input/output interface circuit 105 is mounted on the card body 101a, and can be activated so as to establish communication with the host computing device 109 by way of an appropriate socket via an interface bus 113. The input/output interface circuit 105 may include circuits and control logic associated with a Universal Serial Bus (USB) interface structure that is connectable to an associated socket connected to or mounted on the host computing device 109.

The processing unit 102 is controlled by a software program module (e.g., a firmware (FW)), which may be stored partially in a ROM (not shown) such that processing unit 102 is operable selectively in: (1) a data programming or write mode, where the processing unit 102 activates the input/output interface circuit 105 to receive data from the host computing device 109 and/or the fingerprint reference data from fingerprint sensor 104 under the control of the host computing device 109, and store the data and/or the fingerprint reference data in the flash memory module 103; (2) a data retrieving or read mode, where the processing unit 102 activates the input/output interface circuit 105 to transmit data stored in the flash memory module 103 to the host computing device 109; or (3) a data resetting or erasing mode, where data in stale data blocks are erased or reset from the flash memory module 103. In operation, host computing device 109 sends write and read data transfer requests to the first flash memory device 100 via the interface bus 113, then the input/output interface circuit 105 to the processing unit 102, which in turn utilizes a flash memory controller (not shown or embedded in the processing unit) to read from or write to the associated at least one flash memory module 103. In one embodiment, for further security protection, the processing unit 102 automatically initiates an operation of the data resetting mode upon detecting a predefined time period has elapsed since the last authorized access of the data stored in the flash memory module 103.

The optional power source 107 is mounted on the card body 101a, and is connected to the processing unit 102 and other associated units on card body 101a for supplying electrical power (to all card functions) thereto. The optional function key set 108, which is also mounted on the card body 101a, is connected to the processing unit 102, and is operable so as to initiate operation of processing unit 102 in a selected one of the programming, data retrieving and data resetting modes. The function key set 108 may be operable to provide an input password to the processing unit 102. The processing unit 102 compares the input password with the reference password stored in the flash memory module 103, and initiates authorized operation of the first flash memory device 100 upon verifying that the input password corresponds with the reference password. The optional display unit 106 is mounted on the card body 101a, and is connected to and controlled by the processing unit 102 for displaying data exchanged with the host computing device 109.

A second electronic environment is shown in a second environment in FIG. 1B. The second environment is very similar to the first environment as shown in FIG. 1A. The differences are the optional components (i.e., display unit 106, power source 107 and functional key set 108) are not included in card body 101b of the second electronic flash memory device 120. Instead, such functionalities may be implemented using the existing ones provided by the host computer 109 via the interface bus 113.

Shown in FIG. 1C, the third electronic flash memory device 140 includes a card body 101c with a processing unit 102, an I/O interface circuit 105 and at least one flash memory module 103 mounted thereon. Similar to the two aforementioned environments, the third flash memory device 140 couples to a host computing device 109 via an interface bus 113. Fingerprint functions such as scanning and verification are handled by the host computing device 109.

The fingerprint sensor is adapted to scan a fingerprint of a user and to generate fingerprint scan data. One example of the fingerprint sensor that can be used in the present invention is that disclosed in a co-owned U.S. Pat. No. 6,547,130, entitled "Integrated Circuit Card with Fingerprint Verification Capability", which is incorporated herein by reference herein. The fingerprint sensor described in the above patent includes an array of scan cells that defines a fingerprint scanning area. The fingerprint scan data includes a plurality of scan line data obtained by scanning corresponding lines of array of scan cells. The lines of array of scan cells are scanned in a row direction as well as column direction of the array. Each of the scan cells generates a first logic signal upon detection of a ridge in the fingerprint of the holder of card body, and a second logic signal upon detection of a valley in the fingerprint of the holder of card body.

Figure 1D:
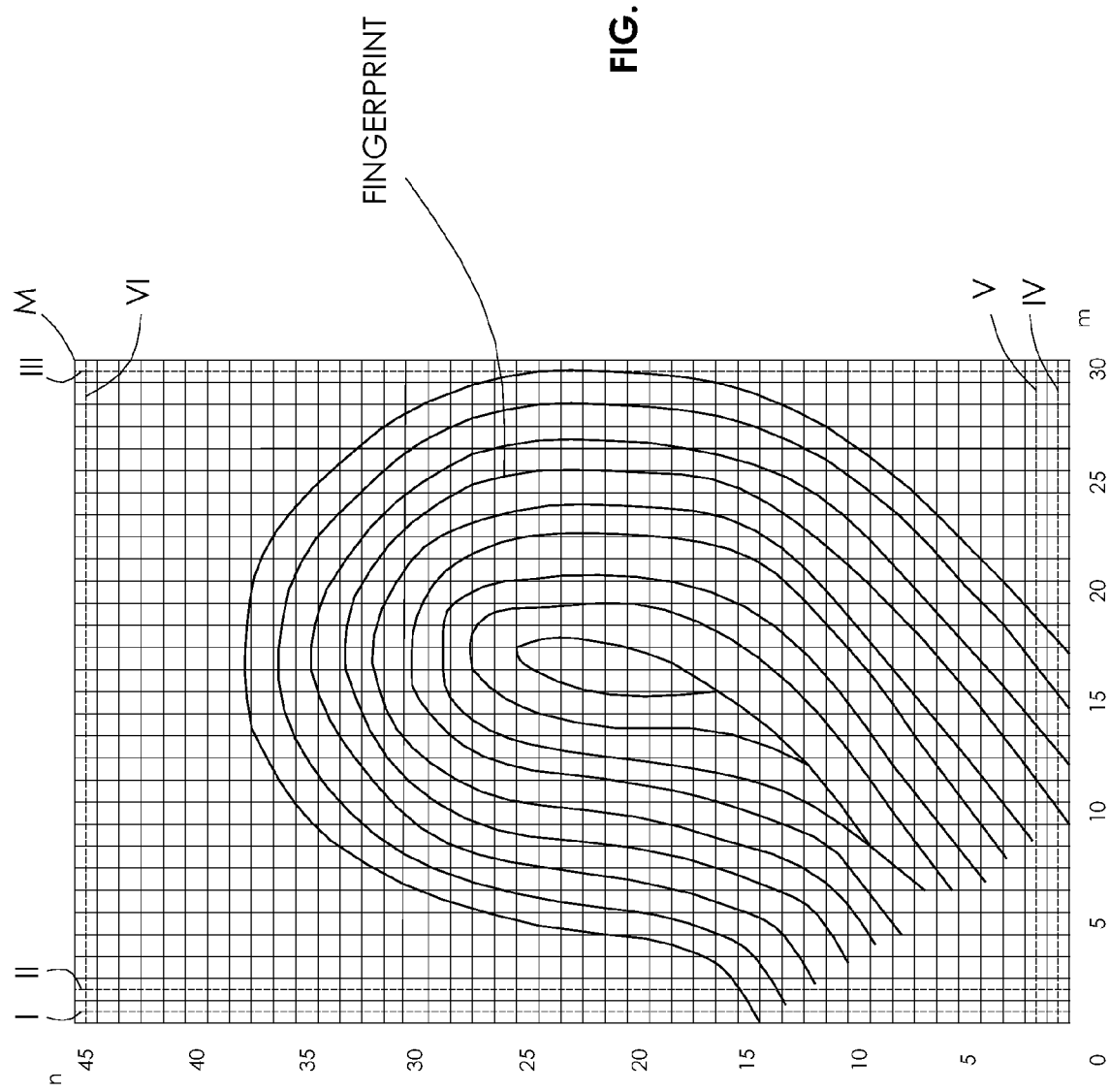

As shown in FIG. 1D, the fingerprint sensor is adapted to scan a fingerprint of a holder of the card body and to generate fingerprint scan data. Referring to FIG. 1D, the fingerprint sensor includes an m×n array of scan cells that defines a fingerprint scanning area (M) The fingerprint scan data includes a plurality of scan line data obtained by scanning corresponding lines of the array of scan cells. The holder of the card body needs to press and hold his/her finger to the surface of the fingerprint sensor. The lines of the array of scan cells can be scanned in a column direction or a row direction of the array. For example, if m=30, n=45, a first scanning line (I) in the column direction is (1'n; n=1.about.45), a second scanning line (II) in the column direction is (2'n; n=1.about.45), and a thirtieth scanning line (III), the last scanning line in the column direction, is (30'n; n=1.about.45). A first scanning line (IV) in the row direction is (m'1; m=1.about.30), a second scanning line (V) in the row direction is (m'2; m=1.about.30), and a forty-fifth scanning line, the last scanning line in the row direction, is (m'45; m=1.about.30). Each of the scan cells generates a high logic signal upon detection of a ridge in the fingerprint of the holder of the card body, and a low logic signal upon detection of a valley in the fingerprint of the holder of the card body.

Figure 1F:
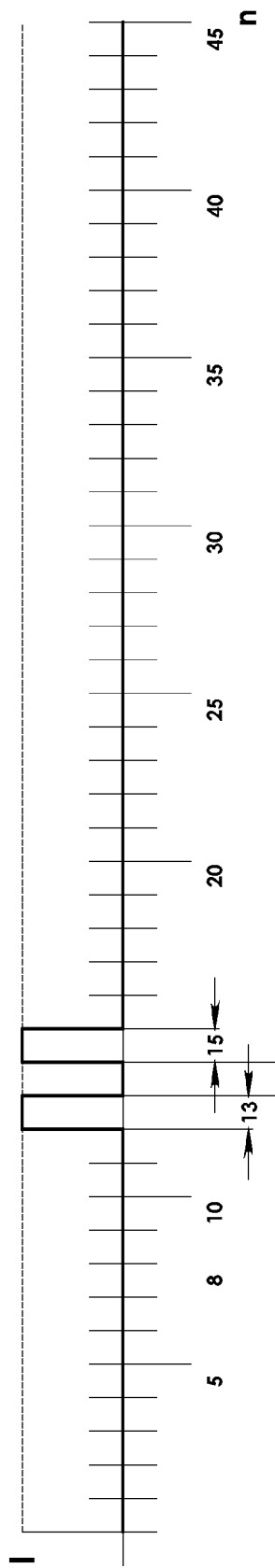
Figure 1G:
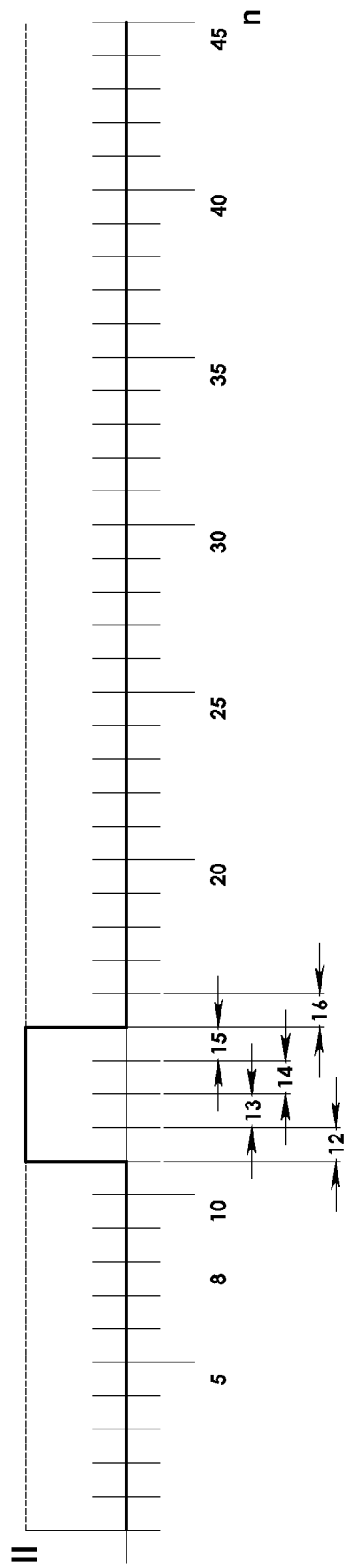
Figure 1H:
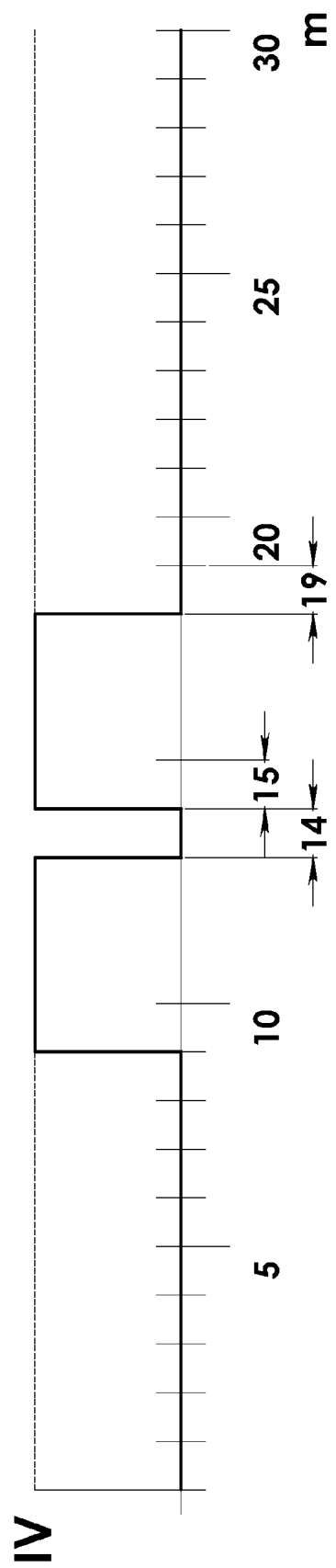

Referring to FIG. 1F, the scan cells (1'13), (1'15) generate a high logic signal, respectively, and the other scan cells generate a lower logic signal for the first scanning line (I) in the column direction in FIG. 1D. FIG. 1G illustrates the scan line data obtained for the second scanning line (II) in the column direction. FIG. 1H illustrates the scan line data obtained for the first scanning line (IV) in the row direction. In view of the unique features of fingerprints, if the card holder is different from the assigned user, the fingerprint scan data will differ from the fingerprint reference data.

As shown in FIG. 1E, the fingerprint sensor versus the one in the FIG. 1D can reduce number of column sector cells such as 8 to reduce the cost. The user need to press and "Swipe" up and down thru the surface of the fingerprint sensor. The firmware of the processing unit will reconstruct the virtual image of the fingerprint shown in FIG. 1D thru many snap shots of the fingerprint sensor. The multi line of the "swipe" sensor is for the purpose of compensating the different swiping speed of the holder of the card body.

Referring back to FIG. 1A, processing unit receives the fingerprint scan data from the fingerprint sensor, and compares the fingerprint scan data with the fingerprint reference data in the memory device to verify if the holder of the card body is the assigned user. The processing unit activates the interface circuit for exchanging the card information with the host computer via communication link upon verifying that the holder of the card body is the assigned user. Thus, the integrated circuit card cannot be used if the card holder is not the assigned user.

The card information can be selected via a function key set and a display of the host computer. For example, when the function key set is selected in a credit card mode, the card information exchanged with the host computer includes the credit card number. Preferably, a segment of the fingerprint reference data stored in the memory device is transmitted by the processing unit to the host computer upon verifying that the holder of the card body is the assigned user for increased security of network transaction. The segment of the fingerprint reference data includes chosen ones of the scan line data selected according to date or time of the exchange of the card information with the host computer. Alternatively, the chosen ones of the scan line data can be selected in a random manner.

According to certain embodiments of the invention, an integrated circuit card adapted is capable of establishing a communications link with a host computer. In one embodiment, an integrated circuit card includes a card body, a memory device mounted on the card body for storing fingerprint reference data obtained by scanning a fingerprint of an assigned user, and for storing card information. The integrated circuit card further includes a fingerprint sensor mounted on the card body and adapted to scan a fingerprint of a holder of the card body and to generate fingerprint scan data and a processing unit mounted on the card body and connected to the memory device. The processing unit receives the fingerprint scan data from the fingerprint sensor and compares the fingerprint scan data with the fingerprint reference data in the memory device to verify if the holder of the card body is the assigned user. The processing unit activates the input/output interface circuit for exchanging the card information with the host computer to verify that the holder of the card body is the assigned user.

The fingerprint reference data includes various scan line data, where each of which describes fingerprint characteristics in a respective scanning line of the fingerprint of the assigned user.

The fingerprint sensor includes an m×n array of scan cells that defines a fingerprint scanning area. The fingerprint scan data includes a plurality of scan line data obtained by scanning corresponding lines of the array of scan cells. The lines of the array of scan cells are scanned either in a row direction of the array in a column direction of the array. Each of the scan cells generates a first logic signal upon detection of the ridge in the fingerprint of the holder of the card body, and a second logic signal upon detection of a valley in the fingerprint of the holder of the card body. The memory device may be a flash memory.

The scan line data of the fingerprint reference data is of a fingerprint scanning area having columns and rows from the scanned fingerprint of the assigned user, and each scan line data is numbered. Each numbered scan line data corresponds to a line selected from the group consisting of an even scanning line in the column direction of the fingerprint scanning area, an odd scanning line in the column direction, an even scanning line in the row direction, and an odd scanning line in the row direction.

Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

Figure 2A:
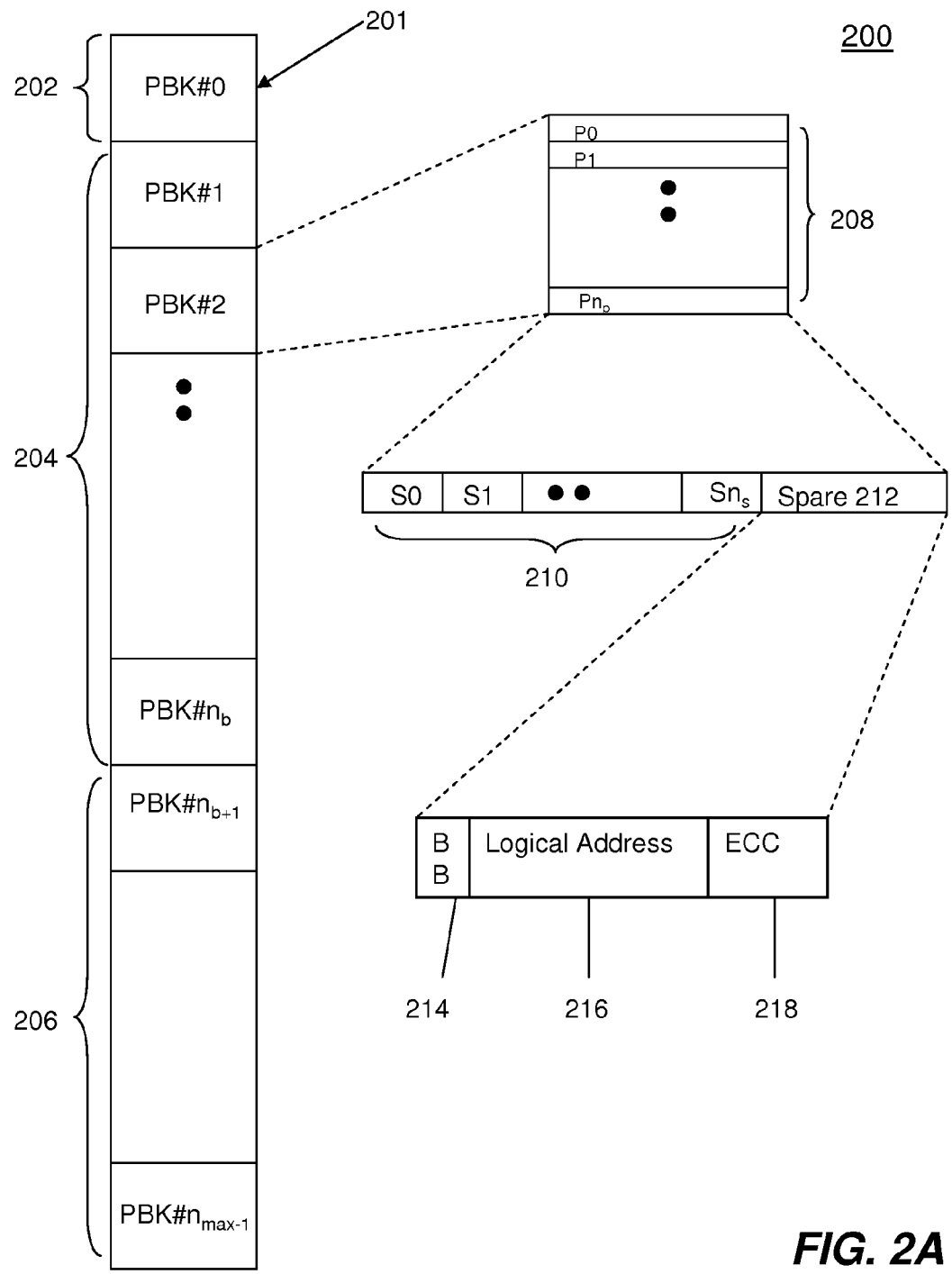
FIG. 2A is a diagram depicting a data structure of an exemplary large capacity flash memory, according one embodiment of the present invention.

Referring now to FIG. 2A, which is a diagram depicting an exemplary data structure 200 of a flash memory module 201 (e.g., flash memory module 103 of FIG. 1C) in accordance with one embodiment of the present invention. The flash memory module 201 is divided into a plurality of physical blocks e.g., PBK#0, PBK#1, PBK#2, . . . ). In general, there are three categories of physical blocks: 1) the first block 202 (i.e., PBK#0); 2) normal usage data blocks 204 (i.e., PBK#1, PBK#2, PBK#$n_b$); and 3) reserved blocks 206 (i.e., PBK#$n_{b+1}$, PBK#$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK#1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Each block is further divided into a plurality of pages 208 (e.g., P0, P1, Pn$_p$). Each of the pages 208 includes a data area 210 and a spare area 212. The data area is partitioned into a plurality of sectors (e.g., S0, S1, Sn$_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the flash memory device. More details are described in FIG. 4E and FIG. 4F for the reserved physical blocks as used by an embodiment of the present invention. Detailed processes of initialization are shown in FIGS. 7A-7E. The ECC area 218 is configured to store the ECC for ensuring data integrity.

In order to access the data stored in the normal usage blocks 204 of the flash memory module 201, the host computing device 109 transmits a data transaction request (e.g., data read or write) along with a logical sector address (LSA) to the flash memory device (e.g., flash memory device 140 of FIG. 1C). The processing unit 102 of the flash memory device converts the received LSA into a physical address (i.e., specific block, page and sector numbers) before any data transaction can be performed. Traditionally, the conversion is performed by an address look up table with a one-to-one relationship to the physical address. This solution works for a flash memory device with relatively small capacity, because the address look up table is implemented with a static random access memory (SRAM). It would not be feasible in terms of cost and physical space to include SRAM that grows linearly as the capacity of the flash memory device especially for a large capacity MLC based flash memory device. For example, a large capacity (say 32 Giga-Byte (GB)) MLC based flash memory device using 2112-byte page (i.e., 2048-byte data plus 64-byte spare) and 128 pages per block, it would require more than 2 MB bytes of SRAM to hold the entire address look up table.

Figure 2B:
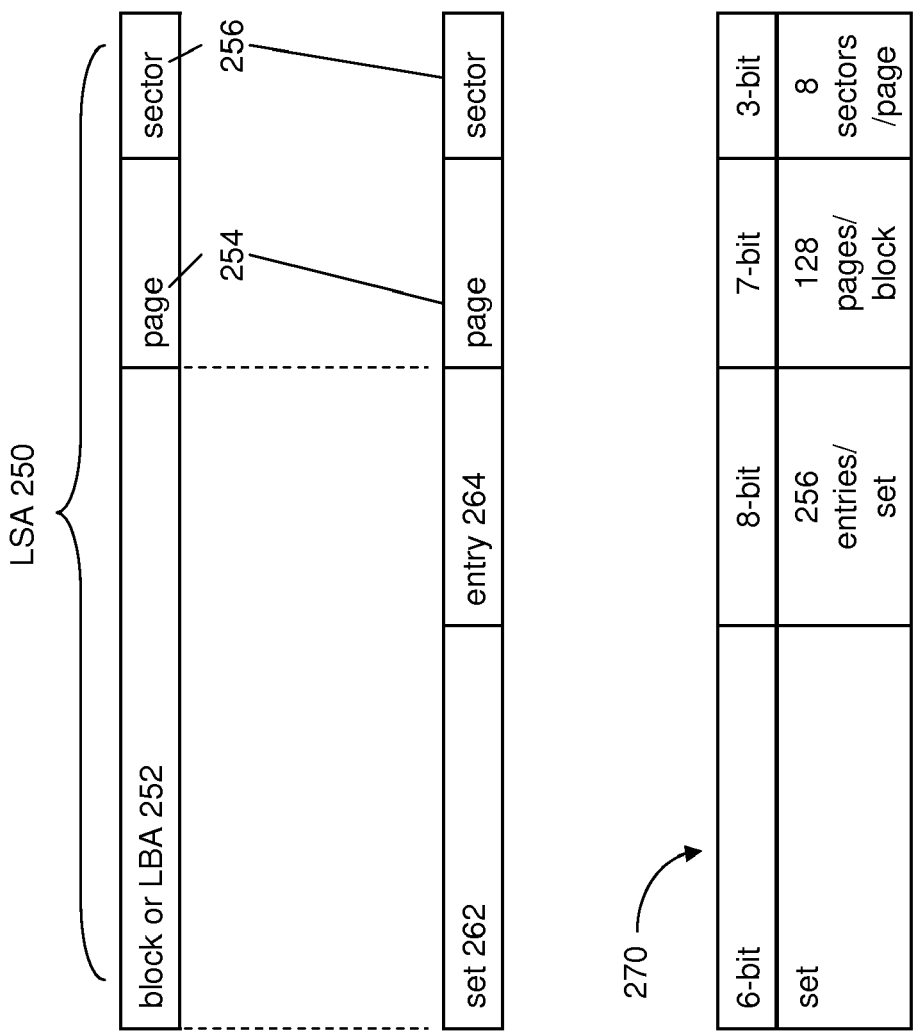
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK#0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', 'PLTPPUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK#) in the flash memory device 140. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 3:
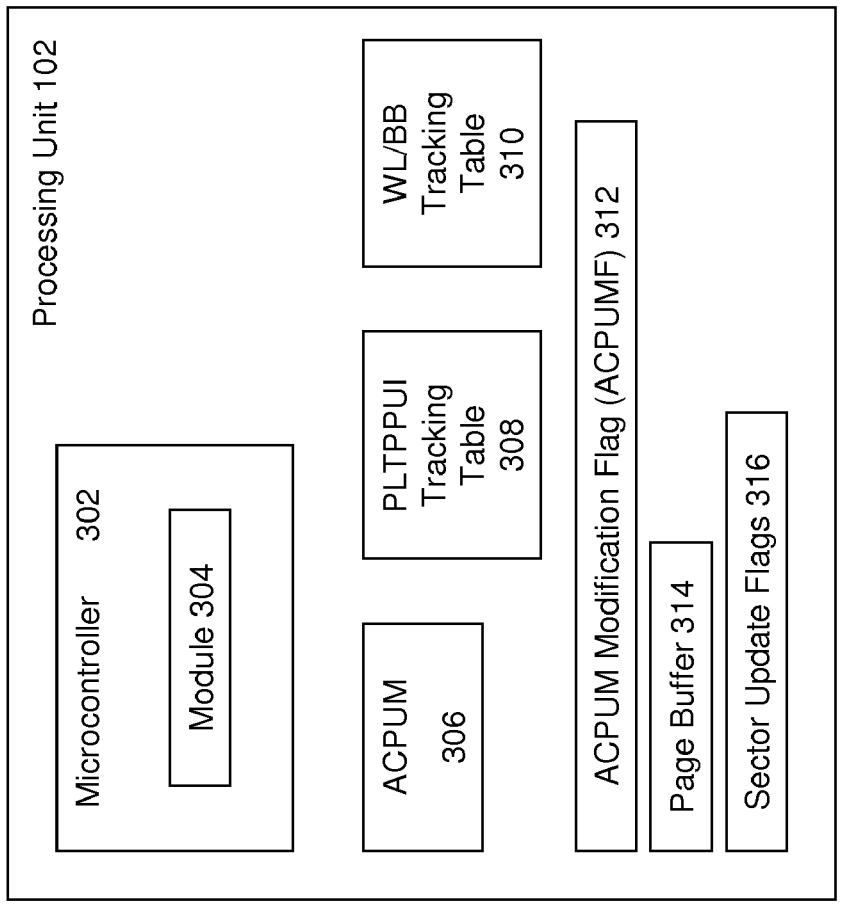
FIG. 3 is a simplified block diagram illustrating salient components of an exemplary processing unit of each of the electronic flash memory devices of FIGS. 1A-1C, according to an embodiment of the present invention.
Figure 4A:
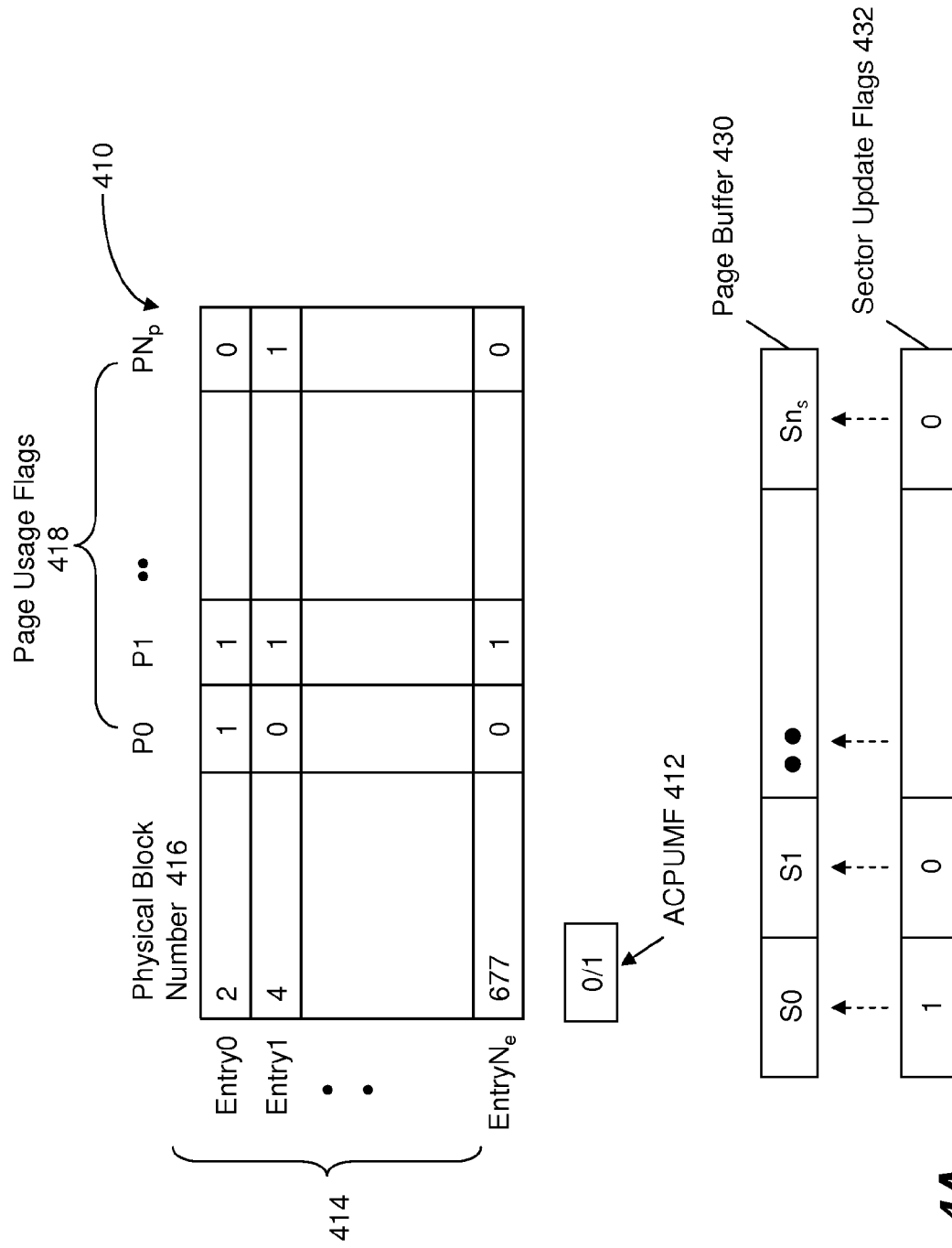
Figure 4B:
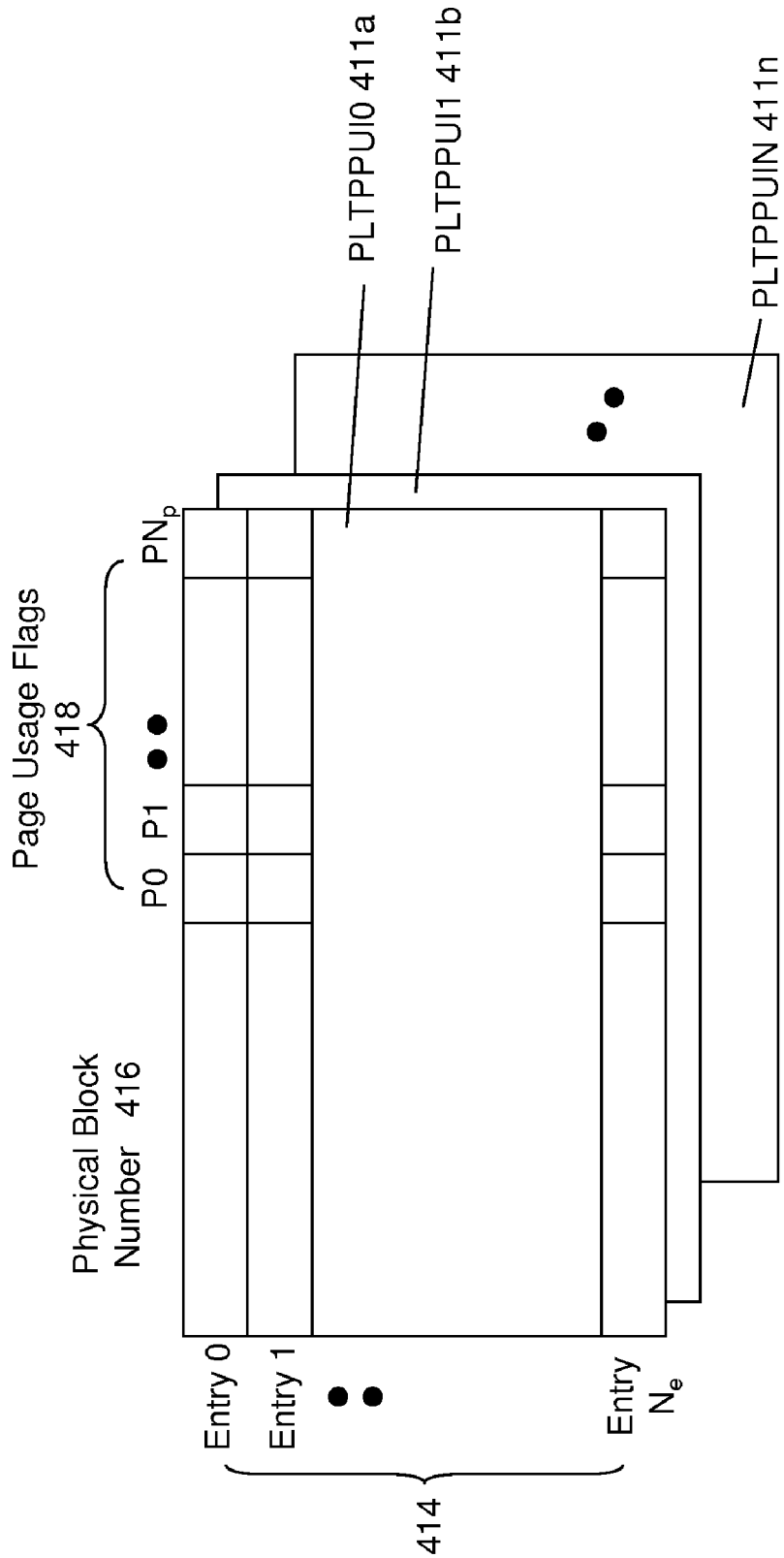

FIG. 3 is a simplified block diagram showing salient components of the process unit 102 of an electronic flash memory device (e.g., flash memory devices 102 of FIG. 1C) in accordance with one embodiment of the present invention. The processing unit 102 comprises a microcontroller or microprocessor 302, an address correlation and page usage memory (ACPUM) 306, a PLTPPUI tracking table 308, a wear leveling and bad block (WL/BB) tracking table 310, a ACPUM modification flag (ACPUMF) 312, a page buffer 314 and a set of sector update flags 316.

The microcontroller 302 with a flash memory controlling program module 304 (e.g., a firmware (FW)) installed thereon is configured to control the data transfer between the host computing device 109 and the at least one flash memory module 103. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK#) 416 and a plurality of page usage flags 418 associated with the PBK#. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, ..., $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK#1000' 422 initially. Due to the MLC flash memory data programming rules, each page can only be programmed or written once (i.e., NOP=1) and data programming within one block can only be in a ascending page order. The second data programming or write can only be into the second page (P1) 424b until the $n^{th}$ write to the last page (Pn) 424n of the block 'PBK#1000' 422. After that, the next data programming, the $(n+1)^{th}$ write, must be written to the first page (P0) 434 of a new physical block (PBK#1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFF0'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures and examples shown in FIGS. 6A-6D. The process 500 is performed by the microcontroller 302 with a flash memory controller program module 304 installed thereon.

The process 500 starts in an 'IDLE' state until the microcontroller 302 receives a data transfer request from a host (e.g., the host computing device 109 of FIG. 1C) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK#) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which the process 500 writes the contents of the ACPUM 306 to one of a plurality of first special logical addresses (e.g., '0xFFFF0000' for PLTPPUI0, or '0xFFFF0001' for PLTP-PUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5A:
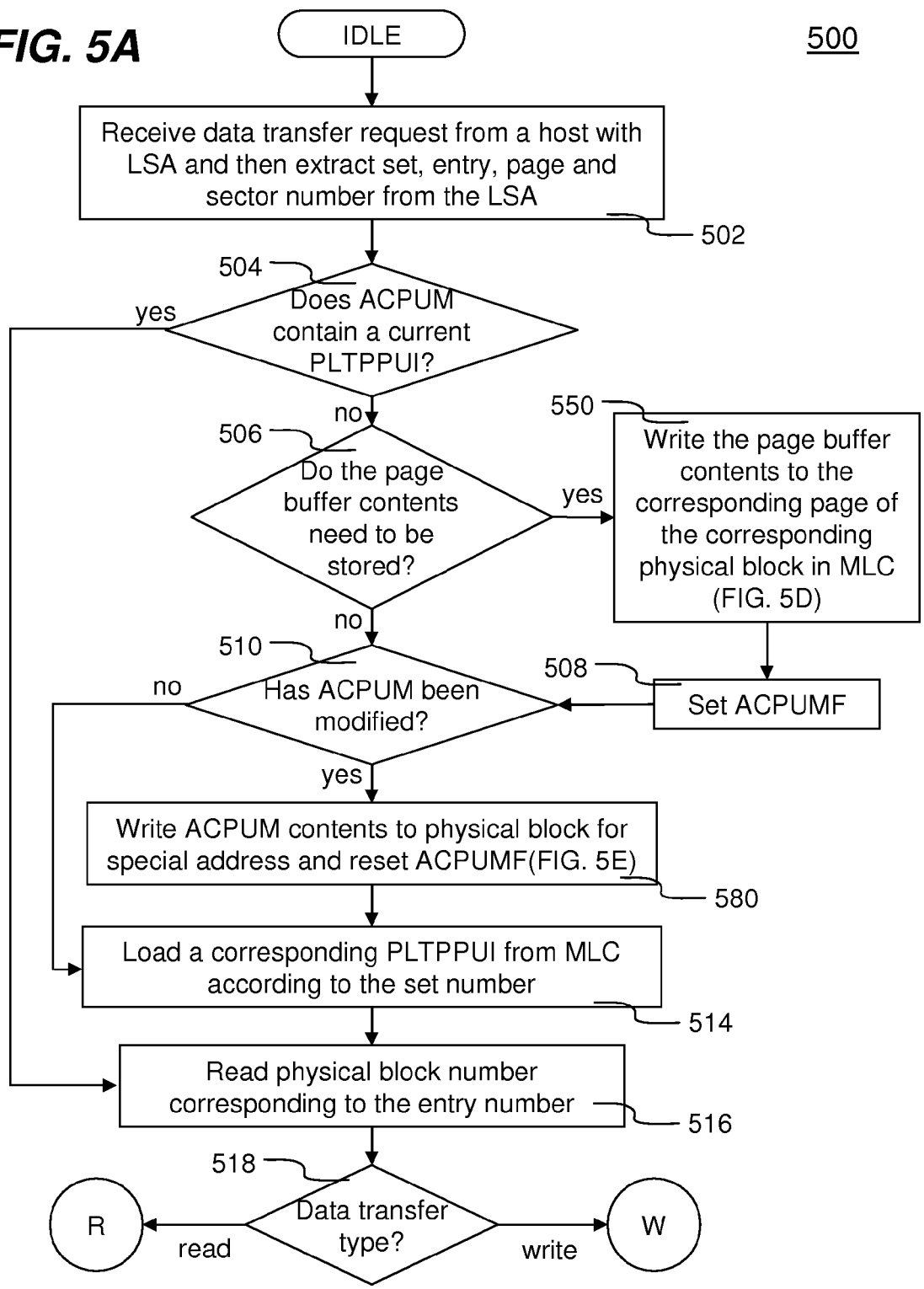
Figure 5B:
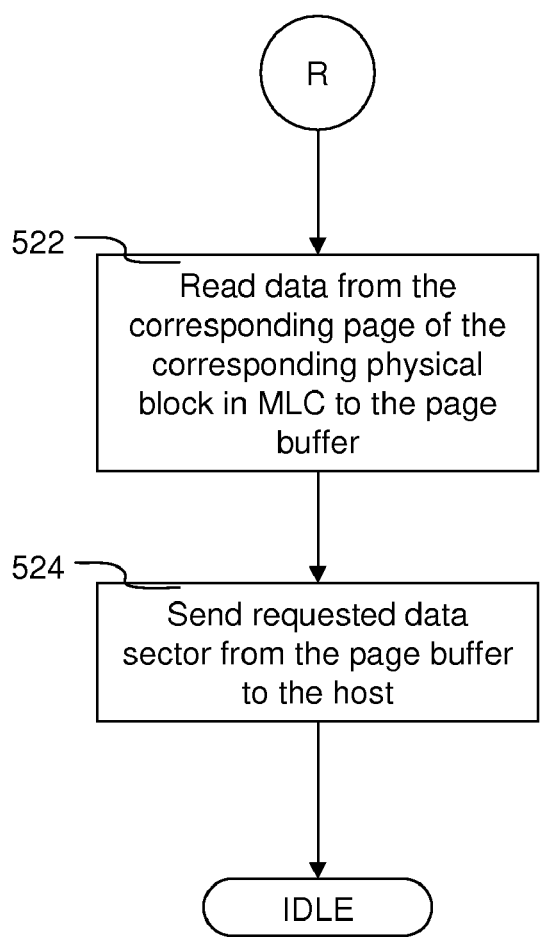

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/program command may be issued to rewrite some of seldom touched physical blocks, for example, physical blocks used for storing user application or system program modules.

Figure 5D:
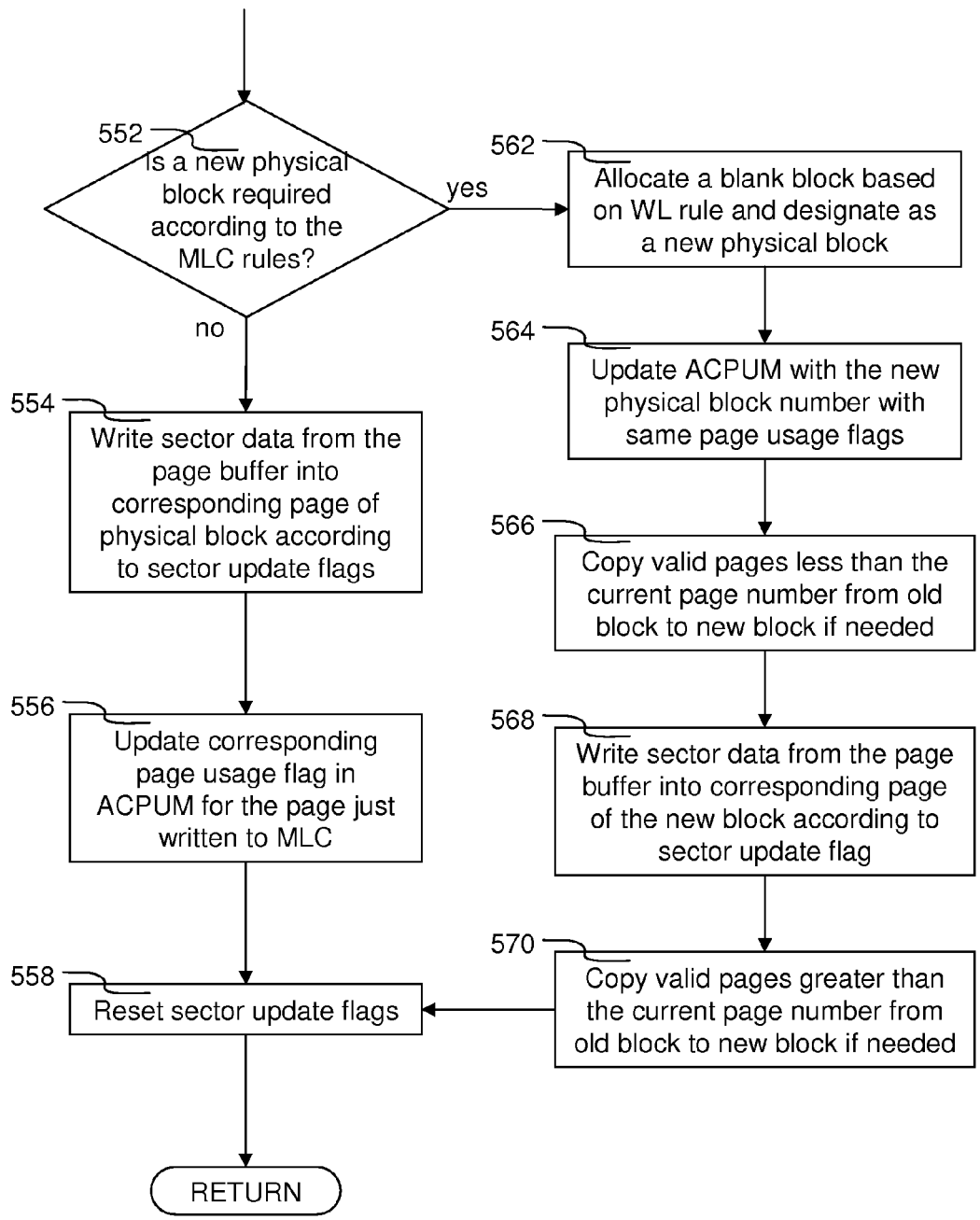

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLT-PPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK#1012) in FIG. 4C) in the reserved area of the flash memory based on the WL rule, and the old physical block (e.g. old physical block (PBK#1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process

500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

FIGS. 6A-6D collectively show a sequence of data write or program requests to demonstrate the exemplary process 500 of FIGS. 5A-5E. In order to simplify the drawings and description, the sequence of the data write requests is perform on an exemplary flash memory with four sectors per page, four pages per block, and four entries per set. As a result of the simplified assumption, the logical sector address (LSA) 602 received along with the data write request can be processed in a scheme corresponding to Table 1. In other words, two least significant bits of the LSA represent the sector number, next two the page number, next two the entry number, and the remaining bits the set number.

The sequence of the data write requests starts with (a) writing to LSA=0, which corresponds to set 0 (i.e., PLTPPUI0), entry 0, page 0 and sector 0. PLTPPUI0 is loaded into ACUPUM 604, in which the first entry (i.e., entry 0) corresponds to physical block 'PBK#2' and page usage flags 606 are not set. The ACPUMF 614 is set to a 'un-modified' status. The sector data (S0) is written to the first sector of the page buffer 610 and the corresponding flag in the sector update flags 612 is set to a 'V' for valid data. The corresponding path in the process 500 for writing LSA=0 is as follows:
  receiving an LSA=0 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (no);
  writing received data sector (S0) into the page buffer and marking corresponding sector ($1^{st}$) update flag at 538; and
  going back to 'IDLE' for next data transfer request.

The next data write request (b) is to write to LSA=1. The corresponding path is the process 500 is as follows:
  receiving an LSA=1 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (yes);
  determining whether page and block number current at 534 (yes);
  writing received data sector (S1) into page buffer and marking corresponding sector ($2^{nd}$) update flag at 538; and
  going back to 'IDLE' for next data transfer request.

The next data write request (c) is to write to LSA=3 (FIG. 6B). The corresponding path is the process 500 is as follows:
  receiving an LSA=3 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (yes);
  determining whether page and block number current at 534 (yes);
  writing received data sector (S3) into the page buffer and marking corresponding sector ($4^{th}$) update flag at 538; and
  going back to 'IDLE' for next data transfer request.

The next data write request (d) is to write to LSA=9 (FIG. 6B). The corresponding path is the process 500 is as follows:
  receiving an LSA=9 and extracting set, entry, page and set numbers at 502;
  determining whether ACPUM contains a current set of PLTPPUI at 504 (yes, PLTPPUI0);
  reading physical block number (PBK#2) at entry 0 at 516;
  determining data transfer request type at 518 (write);
  determining whether page buffer contents have been modified at 532 (yes);
  determining whether page and block number current at 534 (no, same block but different page);
  writing the page buffer contents to the corresponding page (first page of PBK#2) at 550, which includes determining a new block is required at 552 (no); writing sector data to the first page of PBK#2 at 554; updating at the corresponding page usage flag (P0) in ACPUM at 556 and resetting sector update flags at 558;
  setting the ACPUMF (i.e., 1 for 'modified') at 536; and
  writing received data sector (S1) into the page buffer and marking corresponding sector ($2^{nd}$) update flag at 538 before going back to "IDLE".

Figure 6A:
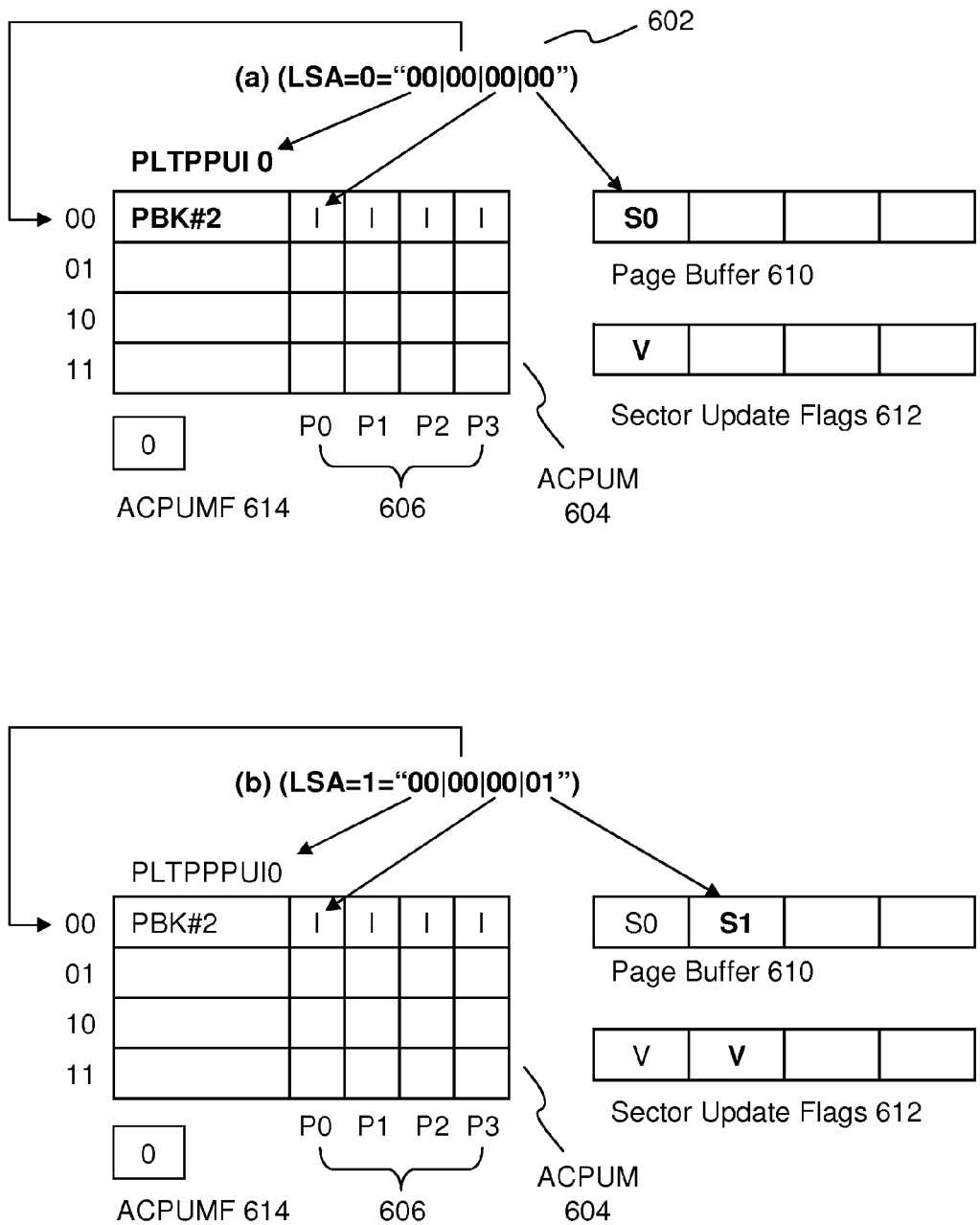
Figure 6C:
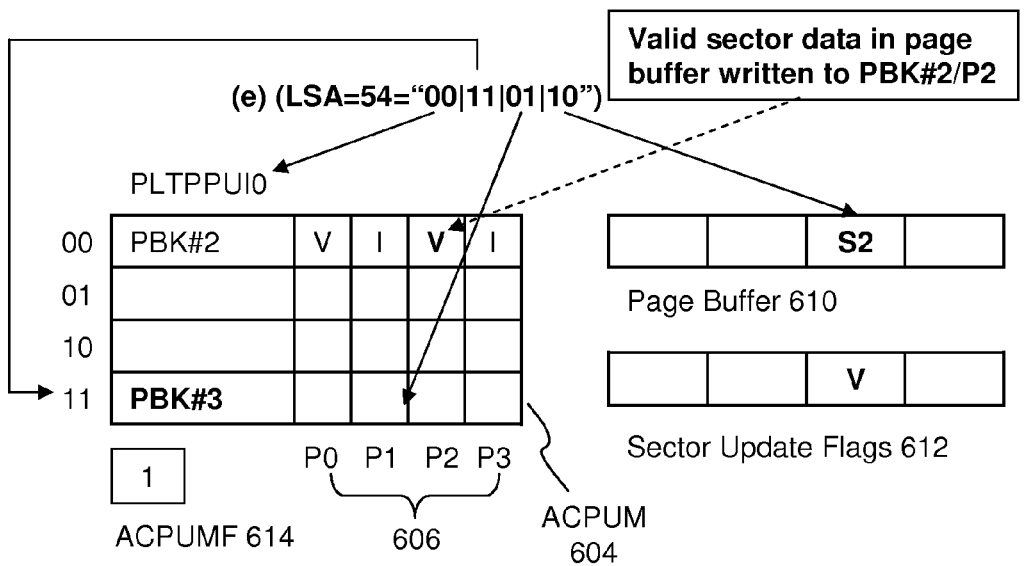

The next data write request (e) is to write to LSA=54 (FIG. 6C). The corresponding path is the process 500 is as follows:
  receiving an LSA=54 and extracting set, entry, page and set numbers at 502;
  determining whether ACPUM contains a current set of PLTPPUI at 504 (yes, PLTPPUI0);
  reading physical block number (PBK#3) at entry 3 (i.e., binary '11') at 516;
  determining data transfer request type at 518 (write);
  determining whether page buffer contents have been modified at 532 (yes);
  determining whether page and block number current at 534 (no, different block);
  writing the page buffer contents to the corresponding page (third page of PBK#2) at 550, which includes determining a new block is required at 552; writing sector data to the third page of PBK#2 at 554 (no); updating at the corresponding page usage flag (P2) in ACPUM at 556 and resetting sector update flags at 558;
  setting the ACPUMF (i.e., 1 for 'modified') at 536; and
  writing received data sector (S2) into the page buffer and marking corresponding sector ($3^{rd}$) update flag at 538 before going back to "IDLE".

Figure 6D:
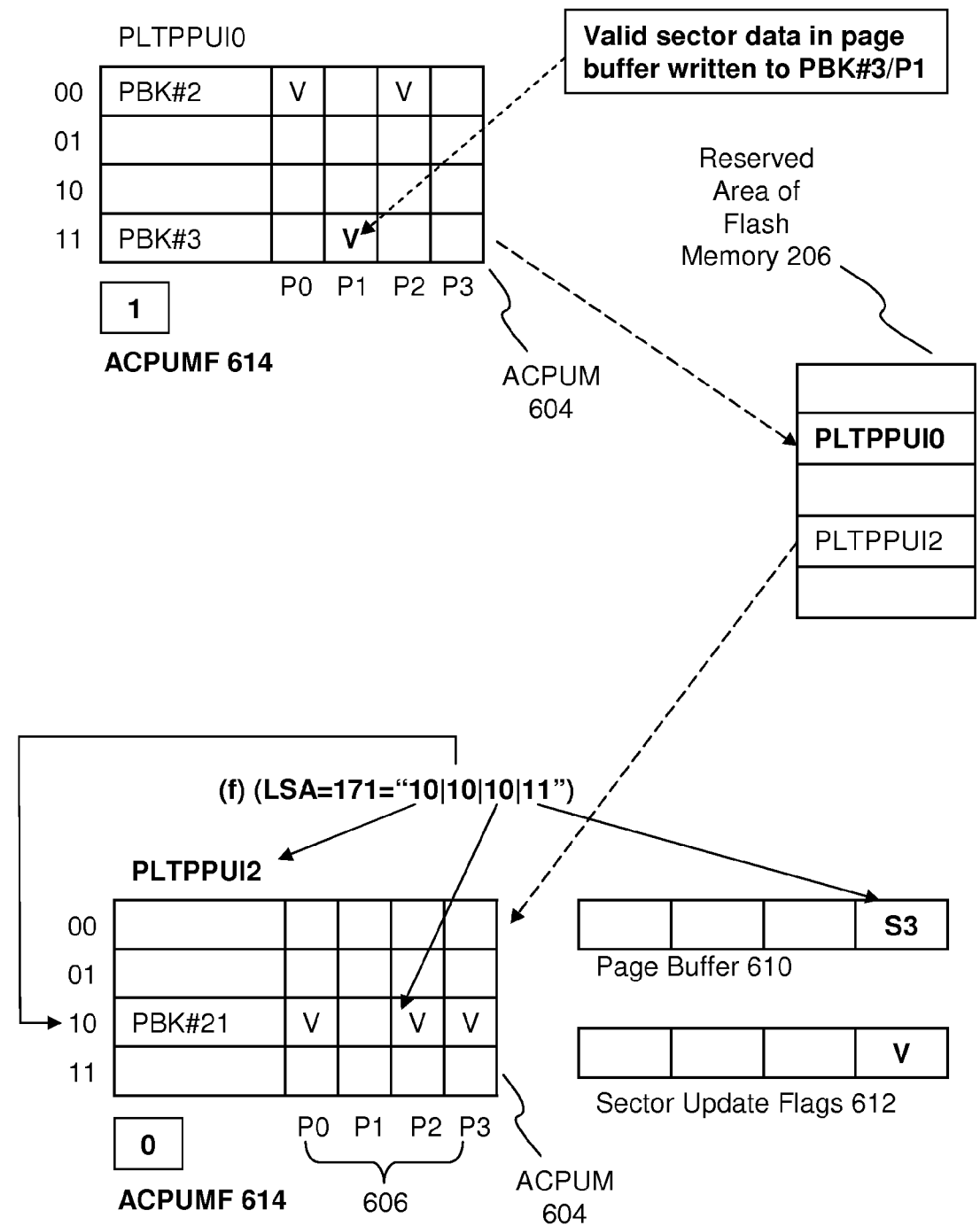
Figure 6E:
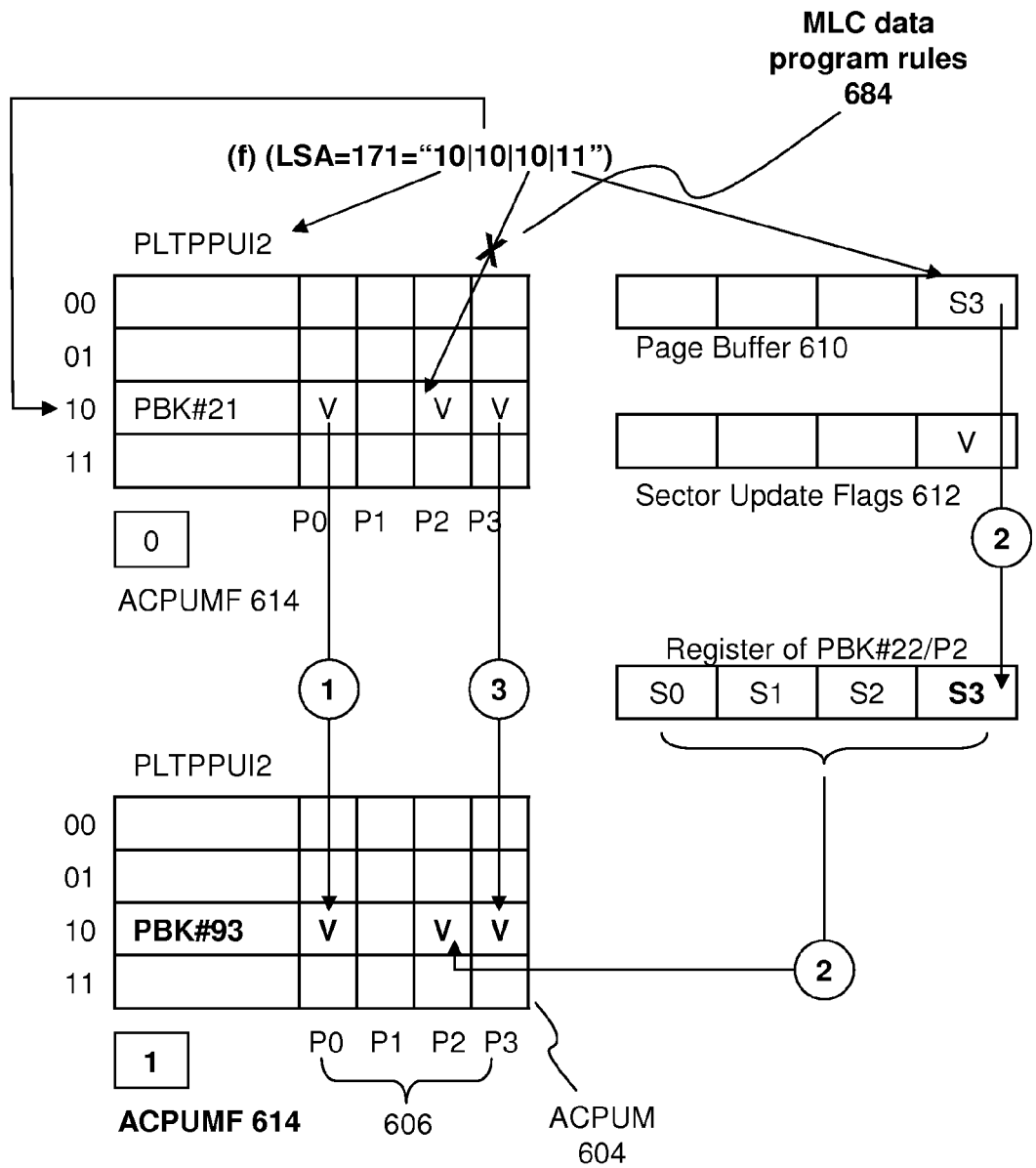

Finally, the next data write request (f) is to write to LSA=171 (FIG. 6D). The corresponding path is the process 500 is as follows:
  receiving an LSA=171 and extracting set, entry, page and set numbers at 502;
  determining whether ACPUM contains a current set of PLTPPUI at 504 (no, PLTPPUI0 does not match PLTPPUI2);
  determining whether the page buffer contents need to be stored at 506 (yes);
  writing the page buffer contents to the corresponding page (second page of PBK#3) at 550, which includes determining a new block is required at 552; writing sector data to the second page of PBK#3 at 554; updating at the corresponding page usage flag (P1) in ACPUM at 556 and resetting sector update flags at 558 and setting the ACPUMF (i.e., 1 for 'modified') at 508; (shown in upper half of FIG. 6D)

determining whether ACPUM has bee modified at 510 (yes);

writing the ACPUM contents to corresponding physical block corresponding to the first special logical address for particular one of the N sets of PLTPPUI (PLTP-PUI0), which includes locating the physical block from the PLTPPUI tracking table at 582; determining if the physical block is full at 584 (no); writing the ACPUM contents to a next page in the physical block at 586; updating the PTLPPUI tracking table with the next page number as the highest page number at 588; and resetting the ACPUMF at 590 (i.e., 0 for 'un-modified');

loading a corresponding set of PLTPPUI (PLTPPUI2) from MLC to ACPUM at 514;

reading physical block number (PBK#21) at entry 2 (i.e., binary '10') at 516;

determining data transfer request type at 518 (write);

determining whether page buffer contents have been modified at 532 (no);

writing received data sector into the page buffer ad marks the corresponding one of the sector update flags at 538 before going back to the 'IDLE' state;

determining whether the 'IDLE' time has exceeded a predefined period at 540 (yes); and performing background recycling of old blocks with stale data and writing the modified page buffer and ACPUM to MLC at 542 (more details in FIG. 6E).

FIG. 6E is a diagram showing a complicated data program or write involving a physical block containing data that prevents another data program operation directly in accordance with the MLC data programming rules. Using the sequence of data write requests shown in FIGS. 6A-6D, after the final data write request (f) has been completed. Both the page buffer 610 and ACPUM 604 have been modified, but yet to be stored in the flash memory. Due to data already existed in certain pages of the physical block (i.e. PBK#21), the MLC data program rules 684 prevent the modified page buffer 610 be written to PBK#21. A new blank block (i.e., PBK#93) is allocated and assigned to hold the data in the old block (PBK#21) including updates from the modified page buffer 610. The corresponding path in the step 550 of the process 500 is as follows:

determining a new physical block is required according to the MLC rules at 552 (yes);

allocating and assigning a new block based on the wear leveling rule at 554;

updating the ACPUM 604 with the new block number (PBK#93) and same page usage flags at 564;

if required, copying the valid pages with page number smaller than the current page number (i.e., P2 or $3^{rd}$ page derived from LSA) from the old block (PBK#21) to the new block PBK#93) at 566 (see STEP 1 in circle in FIG. 6E);

writing sector data (S3) from the page buffer to the register of the corresponding page of PBK#93 and thus updating the page in PBK#93 at 568 (see STEP 2 in circle in FIG. 6E);

if required, copying the valid pages with page number greater than the current page number (i.e., P2 or $3^{rd}$ page derived from LSA) from the old block (PBK#21) to the new block PBK#93) at 570 (see STEP 3 in circle in FIG. 6E); and resetting the sector update flags at 558 before following the remaining data write steps of the process 500.

Referring now to FIGS. 7A-7E, which collectively are a flowchart illustrating an exemplary process 700 of initialization of a large capacity flash memory device in accordance with one embodiment of the present invention. The process 700 starts with a power up, for example, a flash memory device is plugged into a host 109. Next, the process 700 recreates the PLTPPUI tracking table 308 of FIG. 3 from stored N sets of PLTPPUI in the reserved area of the flash memory at 710. Then the process 700 validates the stored wear leveling and error correction code information with actual state of all of the physical blocks at steps 730 and 750, respectively. At 770, the process 700 verifies and validates the store PLTPPUI records against actual state of the physical blocks associated with a plurality of first special logical addresses. Finally, the process loads one of the N sets of PLTPPUI into ACPUM 306 at 790 before the initialization ends. The details of steps 710, 730, 750 and 770 are shown and described in respective FIGS. 7B, 7C, 7D and 7E.

Figure 7A:
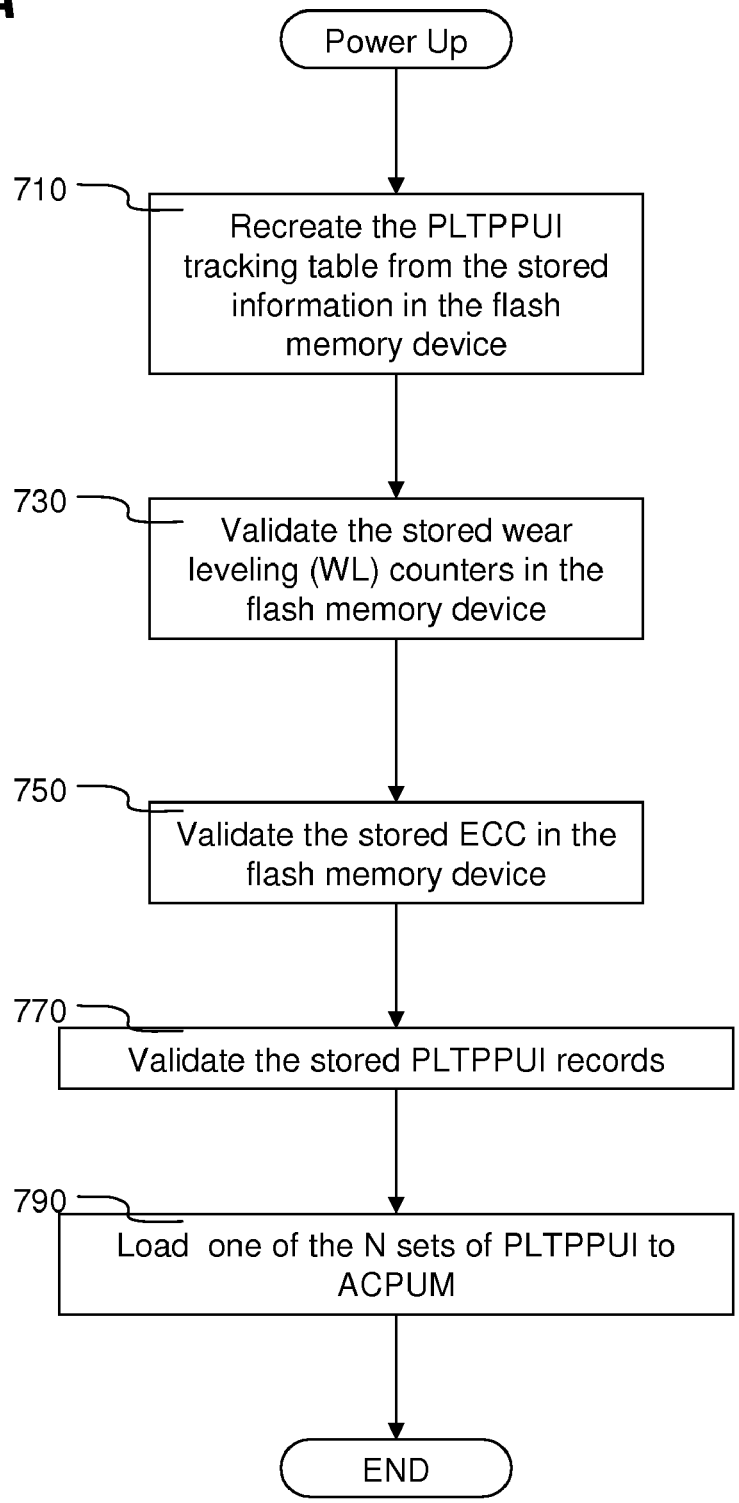
Figure 7B:
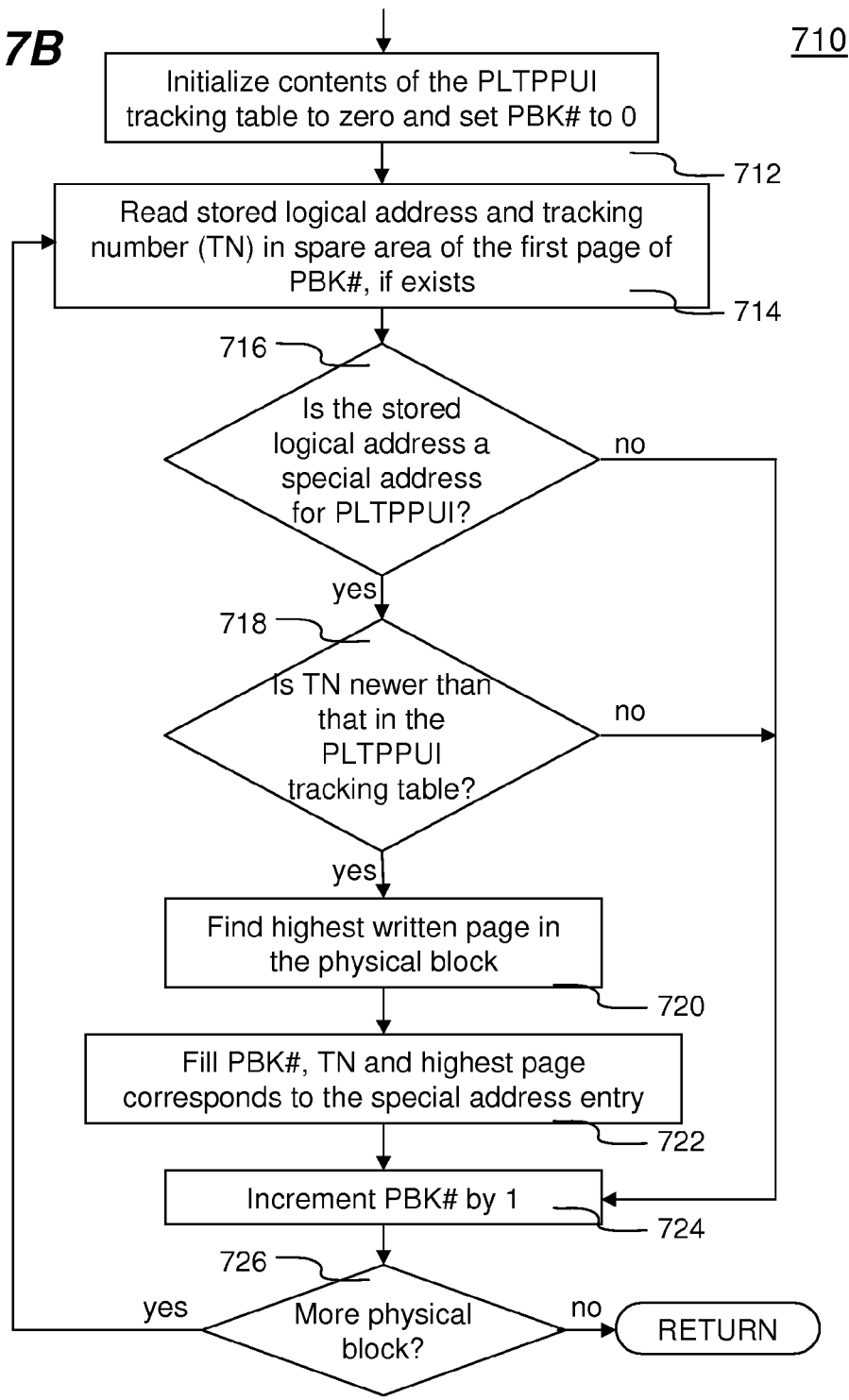

Shown in FIG. 7B, the process 700 initializes contents of the PLTPPUI tracking table 308 to zero and a physical block counter (PBK#) to 0 at 712. Next, the process 700 reads stored logical address and tracking number (TN) in the spare area of the first page of the physical block 'PBK#' at 714. Then the process 700 moves to decision 716, in which it is determined whether the stored logical address is one of the first special addresses for storing PLTPPUI issued by the FW and microcontroller. If 'no', the process 700 simply skips this physical block by incrementing the physical block counter 'PBK#' by one at 724. Next if additional physical block determined at decision 726, the process 700 moves back to step 714 for processing the next physical block, otherwise the step 710 is done.

If 'yes' at the decision 716, the process 700 follows the 'yes' branch to another decision 718. It is then determined whether the stored tracking number is newer than the one listed in the PLTPPUI tracking table 308. For example, the contents in the PLTPPUI tracking table is initialized to zero, any stored tracking number (TN) greater than zero indicates that the stored records are newer. If 'no' at decision 718, the process 700 skips this physical block similar to the 'no' branch of decision 716. However, if 'yes' at decision 718, the process 700 searches and locates a highest written page in this physical block 'PBK#' at 720. Next, at 722, the process 700 writes the 'PBK#', TN and highest page number in the PLT-PPUI tracking table corresponding to the first special logical address. Finally, the process 700 increments the physical block count 'PBK#' by one at 724, then moves to decision 726 to determine either moving back to 714 for processing another physical block or ending the step 710.

Details of step 730 are shown in FIG. 7C. At 732, the process 700 initializes a physical block counter 'PBK#' and a group counter 'm' to zero. Next, the process 700 loads a '$m^{th}$' group of stored WL/BB tracking table into a scratch memory space (e.g., the page buffer 314 of FIG. 3) at 734. Then the process 700 reads the wear leveling (WL) counter and bad block indicator for the physical block 'PBK#' at 736. The process 700 moves to decision 738, in which it is determined whether the stored information is in conflict with the physical state of 'PBK#'. If 'yes', the process 700 corrects the conflict information to be consistent with the physical state in the scratch memory at 740. If 'no' at decision 738, there is no need to correct the conflict.

Next, at 742, the physical block counter 'PBK#' is incremented by one. The process 700 moves to another decision 744, it is determined if there is additional block in the '$m^{th}$' group. If 'yes', the process 700 goes back to step 736 reading another WL counters of another physical block to repeat the above steps until the decision 744 becomes 'no'. The process 700 updates the stored WL/BB tracking table 310 at 746. At next decision 748, it is determined if there is any more physical block. If 'yes', the process 700 increments the group counter at 749 then goes back to 734 for repeating the above steps for another group. Otherwise, the step 730 returns when the decision 748 is 'no'.

FIG. 7D shows details of step 750, which is substantially similar to the step 730. Instead of checking and correcting conflict WL/BB information, the step 750 validates and corrects the stored error correction code (ECC) for all physical blocks. The number of group is related to the size of the scratch memory. For example, a 2048-byte page buffer can provide space for holding a group of 1024 WL counters, if each of the WL counters is a 16-bit number. As to the 8-bit ECC, the same 2048-byte page buffer may hold a group of 2048 ECC codes.

Figure 7E:
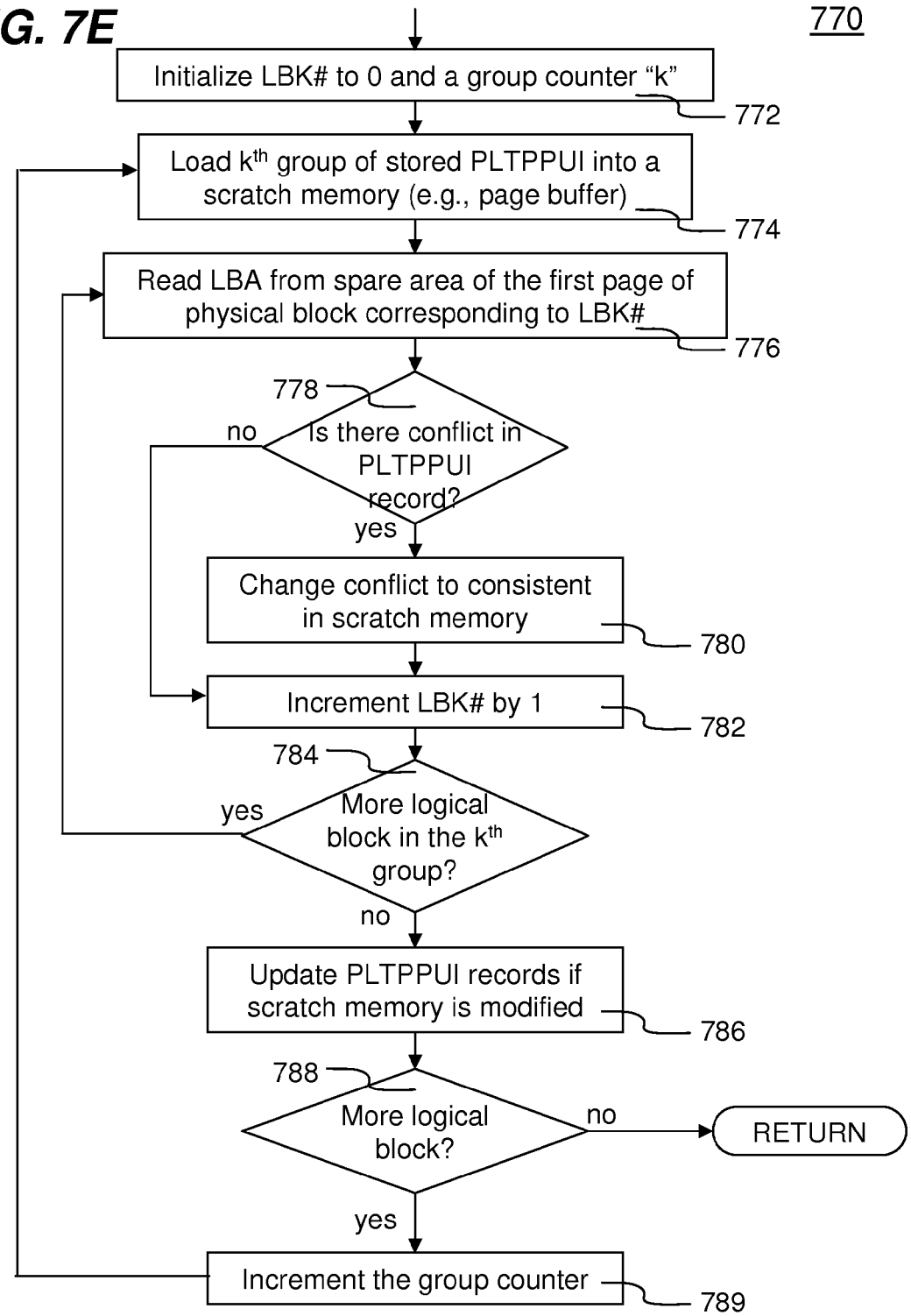

FIG. 7E shows details of step 770. At 772, the process 700 initializes a logical block counter 'LBK#' and a group counter to zero. The process 700 loads a '$k^{th}$' group of stored PLTP-PUI into a scratch memory space (e.g., a page buffer or other available memory) at 774. The process 700 reads logical block address from the spare area of the first page of a physical block corresponding to the 'LBK#' at 776. Next, at decision 778, it is determined whether there is conflict between the stored PLTPPUI and the physical page usage of the physical block. If 'yes', the conflict is corrected with the physical state in the scratch memory at 780. Otherwise, the process 700 skips step 780. Next, at 782, the process 700 increments the logical block counter 'LBK#' by one. The process 700 then moves to another decision 784, in which it is determined if there is more block in the '$k^{th}$' group. If 'yes', the process 700 moves back the step 776 repeating the process until the decision 784 becomes 'no'. Then the process 700 updates the stored PLTPPUI records if the scratch memory has been altered at 786. Next, at decision 788, if there is more logical block, the process 700 follows the 'yes' branch to step 789 by incrementing the group counter and repeating the process from step 774 until the decision 788 becomes 'no', in which the step 770 ends.

Each entry record of PLTPPUI is 18-byte, which is a sum of 2-byte physical block number plus 128-bit (i.e., 16-byte) of page usage flags (i.e., 128 pages per block). Using 2048-byte page buffer as a scratch memory can only hold a group of 113 entry records. One may use a larger memory such as ACPUM 306 as the scratch memory, which may hold more entry records thereby reducing the initialization time.

According to certain embodiments of the invention, the above described flash memory devices can be manufactured using an efficient manufacturing process. FIG. 8 is a flow diagram illustrating a process of manufacturing a flash memory device according to one embodiment of the invention.

Figure 9B:
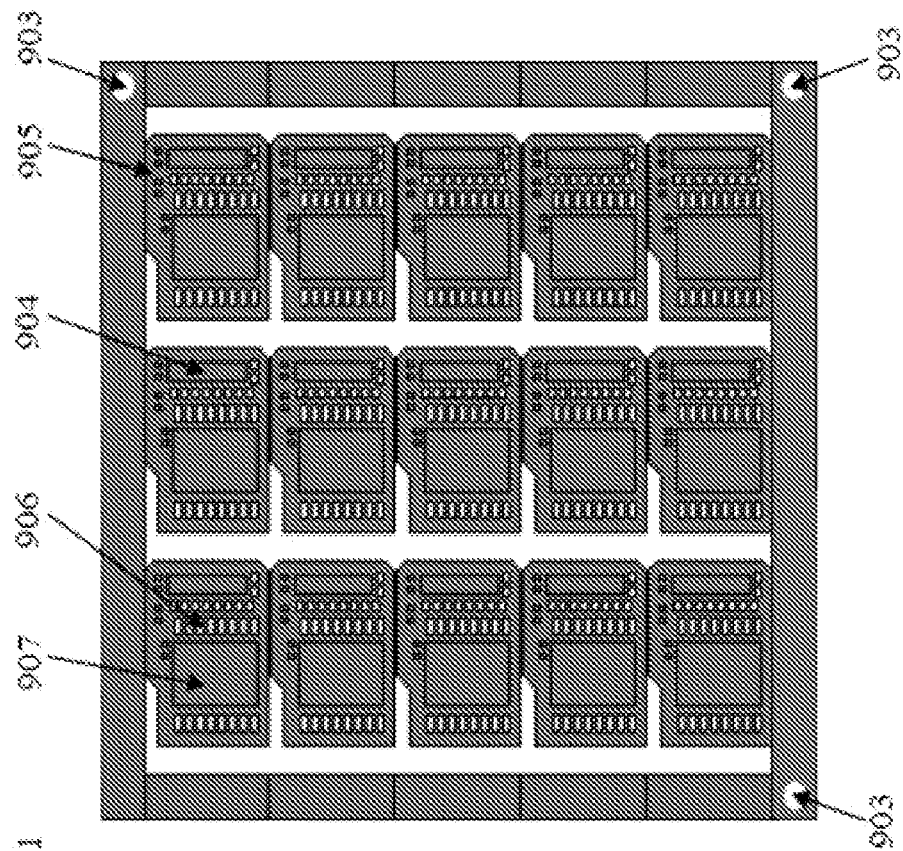
FIGS. 9A-9C show a PCB panel in different views as part of a procuring process according to one embodiment of the invention.
Figure 9A:
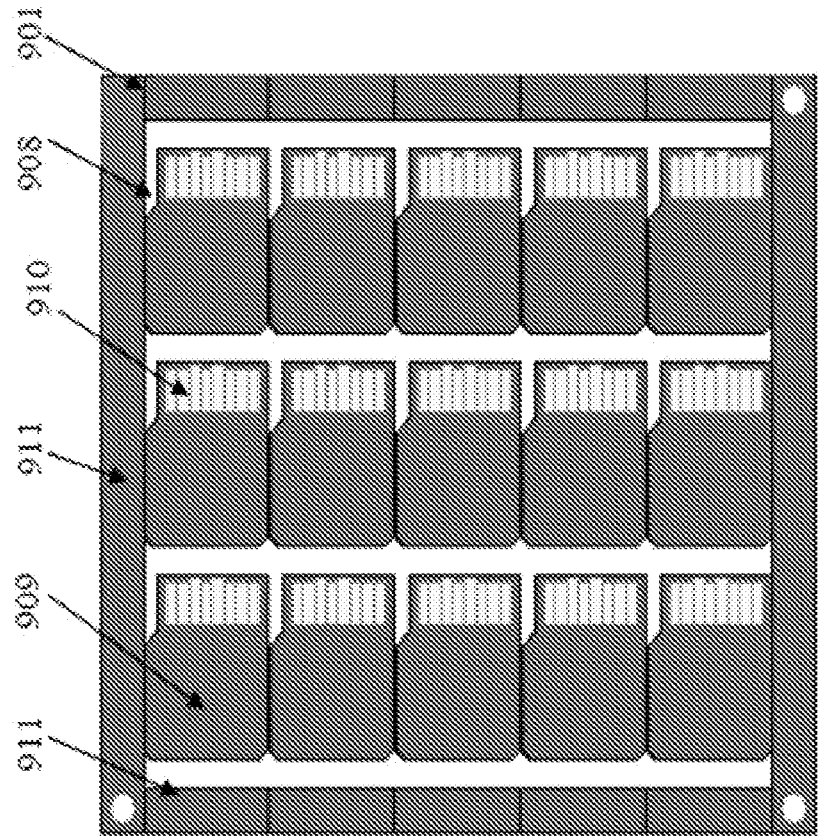
Figure 9C:
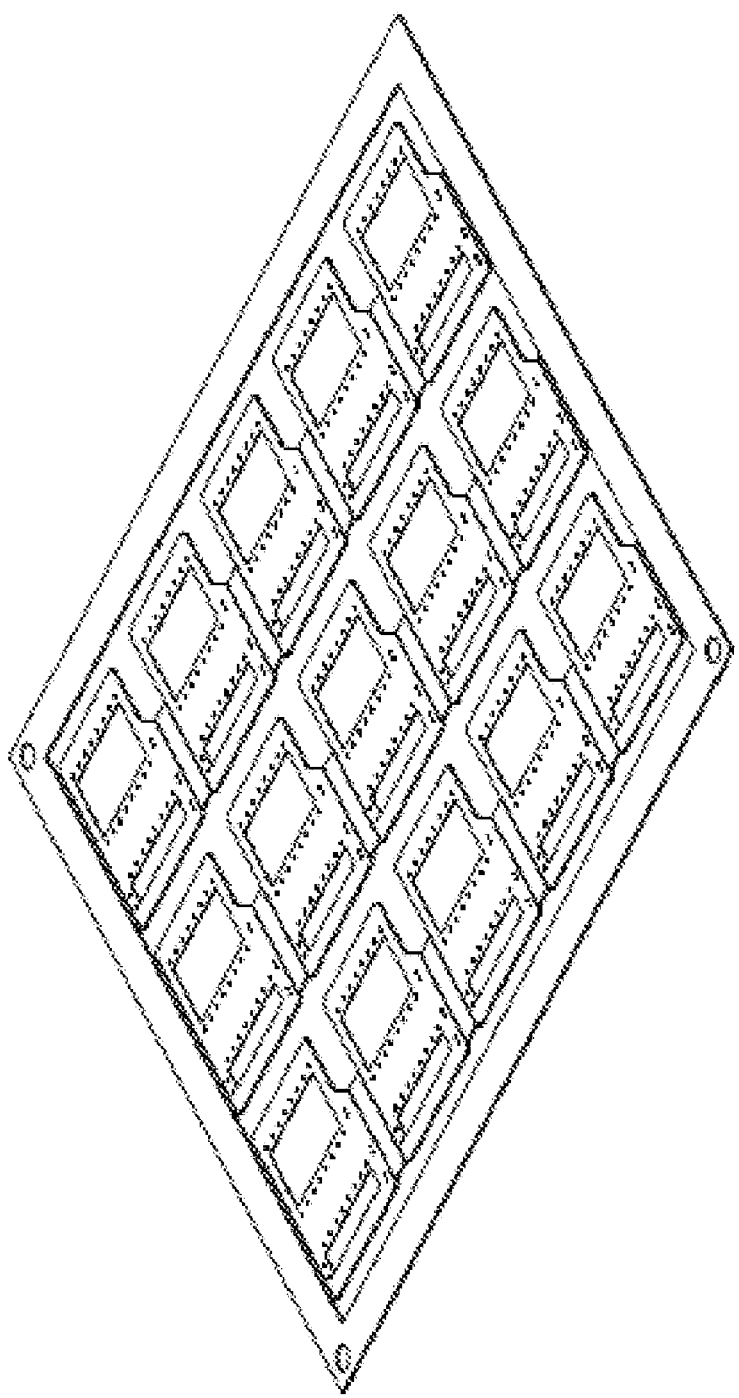

Referring to FIG. 8, at block 310, printed circuit board is provided in a panel form. The PCB panel used in this process invention here is made up of a 5×3 matrix of individual micro flash memory PCBs as shown in FIG. 9A (top side), FIG. 9B (bottom side), and FIG. 9C (perspective view). The PCB panel as shown in FIGS. 9A-9C includes singulation cut lines 901 (horizontal), index and alignment holes 903, controller die location 904, passive components SMT (surface mount technology) pads 905, controller and flash memory dies bonding fingers 906, MLC flash memory die 907, micro flash memory cards outline 908. The PCB panel further includes a top side surface covered with black color. Black is the choice color because the plastic compound molded on the other surface is normally black in color. The PCB panel further includes solder mask 909 to hide circuit lines underneath, top side 8-pin connector's contact fingers 910, and molding outline 911.

At block 342 of FIG. 8, a wafer back grind process is performed. FIGS. 10A-10C shows a representation of either flash memory wafer or controller wafer. Referring to FIGS. 8 and 10A-10C, the corner partial dies 1002 are inked out during die probe wafer testing. The un-patterned bare silicon 1001 is shown in both FIG. 10A and also shown at both ends of the cross sectional view FIG. 10B. The normal inked dies 1003 are complete dies that failed electrical function or DC/AC parametric tests. The wafer is first mount face down on the sticky tape which is pre-taped on a metal or plastic ring frame. Each of this ring-frame with wafer is loaded onto a vacuum chuck (with very leveled and flat surface) that has diameter larger than that of the wafer. The wafer is then proceeds to be grinded down (ground) to the pre-programmed thickness T3. Where T3=(T1−T2). Ground wafer is cleanse by DI (de-ionized) water during the process and also flush clean again with significant more DI water at the end of mechanical grinding process and follow by spinning the wafer at high speed to air dry the wafer. FIG. 10B shows cross sectional view along A-A' plane of wafer before grinding process with original wafer thickness T1. FIG. 10C shows cross sectional view along A-A' plane of wafer after grinding process that left T3 thickness.

Referring back to FIG. 8, at block 344, a wafer dicing process is performed. After the back grind process has completed, the sticky tape at the front side of the wafer is removed and the wafer is once again being taped onto another new ring frame of sticky tape at the backside of the newly grinded wafer. The ring framed wafers are loaded into a circular saw machine to dice up into individual IC chip. The die saw machine was pre-programmed with the correct die size information, X-axis and Y-axis scribe lanes' width, wafer thickness and intended over cut depth. Proper saw blade width is selected based on the widths of the XY scribe lanes. The cutting process begins with dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process indexes to the second lane according to the die size and scribe width distance. After all the X-axis lanes have been completed sawing, the wafer chuck with rotate 90 degree to align the Y-axis scribe lanes to be cut. The cutting motion is repeated until all the scribe lanes on the Y-axis have been completed. FIG. 11A represents the cross sectional view of the wafer along A-A' plane before dicing (Wafer Saw) process. FIG. 11B represents the cross sectional view of the wafer along A-A' plane after dicing (Wafer Saw) process. FIG. 11B has the un-patterned bare silicon 1001 removed and each die is spaced out wider from the adjacent dies.

Figure 12B:
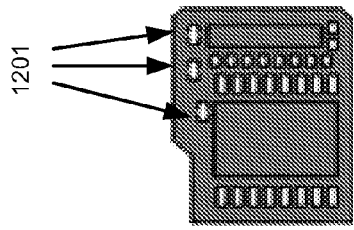
FIGS. 12A-12C show a PCB panel in different views as part of an SMT process according to one embodiment of the invention.
Figure 12C:
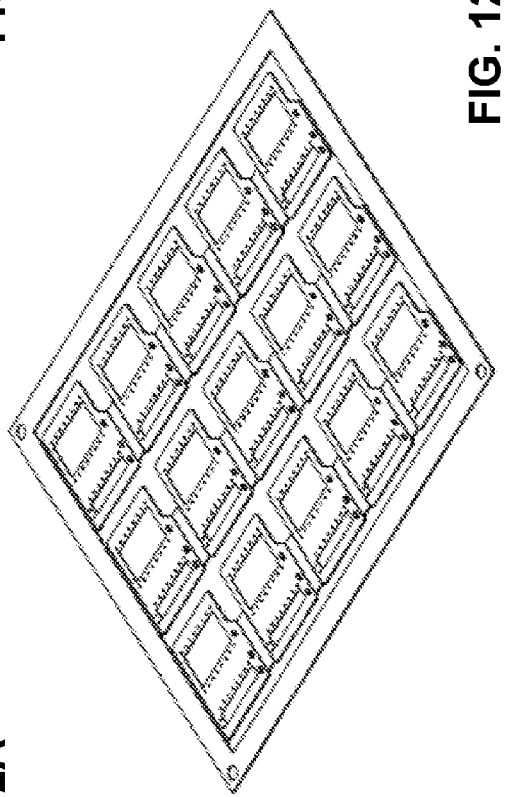
Figure 12A:
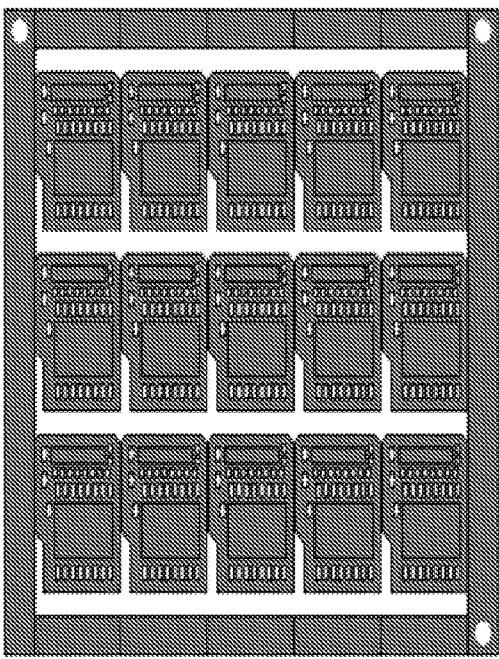

Referring back to FIG. 8, at block 320, an SMT process is performed, in which passive components such as capacitors and resistors are to be mounted onto the bottom surface of each of the individual micro memory card PCB. The first stage of the SMT process is to print lead-free solder on the finger pads of the components using custom made stencil which tailored to the design and layout of that particular micro flash memory card. After being dispensed with solder paste, the panel is then conveyed to a pick and place machine to mount resistor and capacitor components 1201 on it. Upon completion of pick and place components mounting process, the PCB panel is then passed through an IR-reflow oven with a proper temperature profile. The solder of each pad on the PC board is fully melted during the peak temperature zone of the oven and these melted solder connect all pins of the passive components to the finger pads of the PC board. Sub-assembled panel that has completed SMT process is as shown in FIG. 12A and individual PCB enlarged view in FIG. 12B, where a perspective view shown in FIG. 12C.

Referring back to FIG. 8, at block 346, a die bonding (DB) process is performed, which is to attach controller and flash memory dies onto its designated locations on the micro flash memory card PCB. At the die bonding station, referring to FIGS. 8 and 13A-13 C, an operator loads the diced wafers and the components mounted PCB panels onto Die Bonder machine. The machine picks the first PCB panel from the bottom stack of the magazine and transports the PCB panel from the conveyor track to a die bond (DB) epoxy dispensing target area. The magazine lowers a notch automatically to get ready for the machine to pick up the second piece (the new bottom piece) in the next cycle of die bond operation.

At the die bond epoxy dispensing target area, the machine automatically dispenses DB epoxy, using pre-programmed write pattern and speed with the correct nozzle size, onto the target areas of each of the PCB board of the panel. When all the PCB boards of the panel have completed epoxy dispensing, the panel is then conveyed to the Die Bond (DB) target area. Meanwhile, at the input stage, the magazine is loaded with a second PCB panel to this vacant DB epoxy dispensing target area. At the Die bond target area, the pick up arm mechanism and collet (e.g., suction head with rectangular ring at the perimeter so that vacuum from the center can create a suction force) pick up a single die 1301 from the diced wafer and bond it onto the PCB board area where epoxy has already dispensed for the bonding purpose.

Figure 13B:
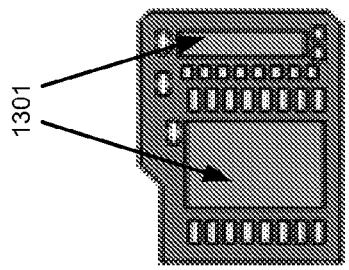
FIGS. 13A-13C show a PCB panel in different views as part of a die bonding process according to one embodiment of the invention.
Figure 13C:
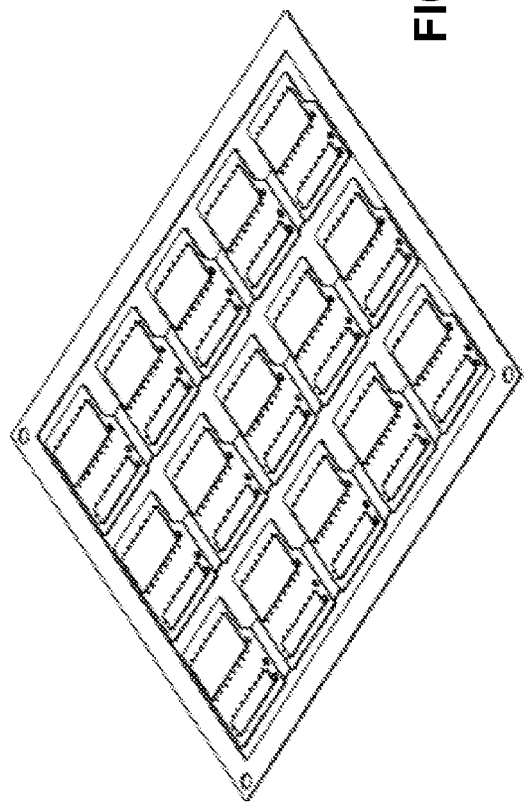
Figure 13A:
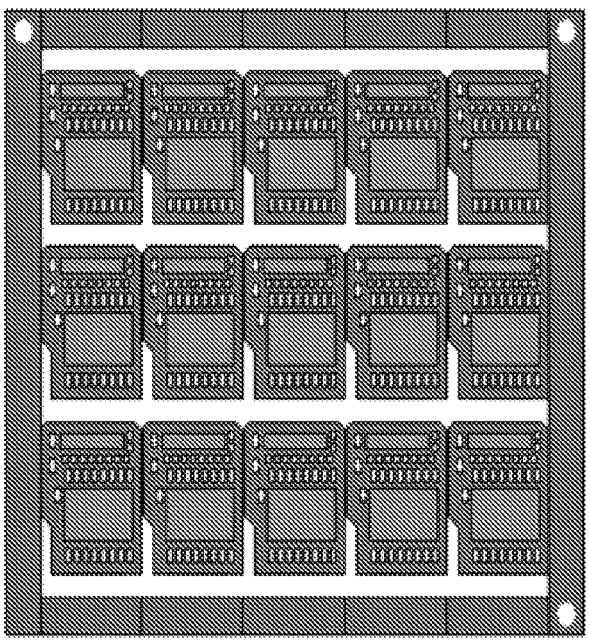

Once all the PCB boards on the panel have been completed in the die bonding process, the panel is then conveyed to a snap cure region where this panel passes through a chamber that has a heating element that radiating IR heat to cure the epoxy thermally in a very short time. After curing, the panel is conveyed into an empty slot of the magazine waiting at the output rack of the Die Bonding machine. The magazine then moves up one slot after receiving a new panel to get ready for accepting the next panel in the second cycle of process. The die bonding machine repeats the above operations until all the panels in the input magazine has exhausted. This process may repeat again for the same panel for stack die products that may require to stacks more than one layer of memory die. FIG. 13A depicts the partial product after controller die and memory die had attached at its designated locations. FIG. 13B shows the enlarged view of the individual PCB after the die bond process. FIG. 13C shows a 3D view of the PCB panel.

Referring back to FIG. 8, at block 348, a wire bonding process is performed. During this process, partial processed PCB panels are loaded onto the magazine input rack of a Wire Bonder (WB) machine. The wire bonder is prepared with the correct wire bonding set-up and sequence program to process this specific micro flash memory card product. The coordinates of all the ICs' pads and PCB gold fingers were previously determined and programmed on the wire bonder.

Figure 14B:
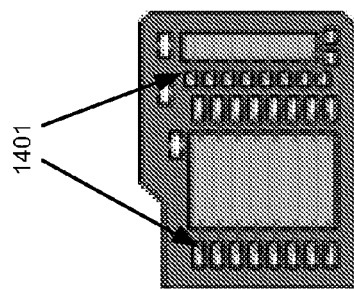
FIGS. 14A-14C show a PCB panel in different views as part of a wire bonding process according to one embodiment of the invention.
Figure 14C:
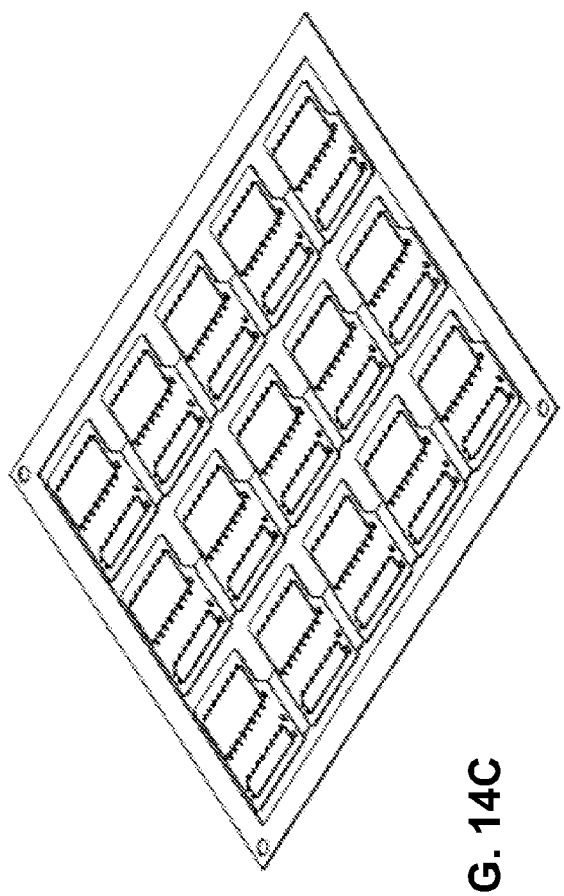
Figure 14A:
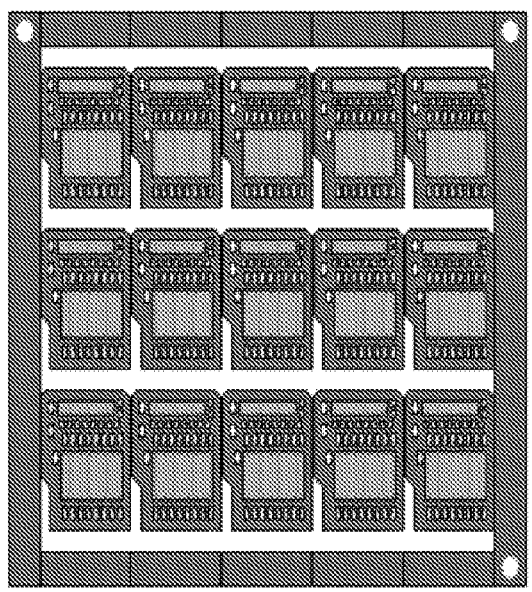

After the PCB panel with the attached dies is loaded onto the WB machine, the operator will teach the machine to use optical vision to recognize the location of the first wire bond pin of the first flash memory die or first controller die of the first PCB on the panel. Once the first pin is correctly set, the machine can carry out the whole wire bonding process for the rest of the panels of the same product type automatically. The above operations are repeatedly performed between die bonding process and wire bonding process until the requested stacked layers have completed. FIG. 14A shows a panel of micro flash memory card PCB with all the memory dies and controller dies that had bonded with gold wires 1401 between the die pads and the PCB finger pads. FIG. 14B shows the enlarged view of the individual PCB after the wire bond process. FIG. 14C shows a perspective view of the PCB panel.

Figure 15A:
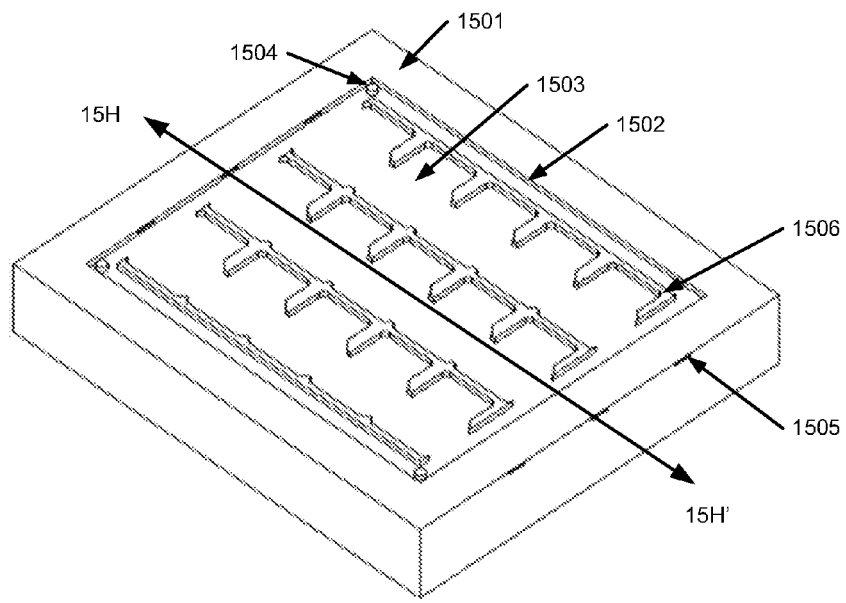
FIGS. 15A-15C show a molding block in different views as part of a molding process according to one embodiment of the invention.
Figure 15B:
Figure 15C:
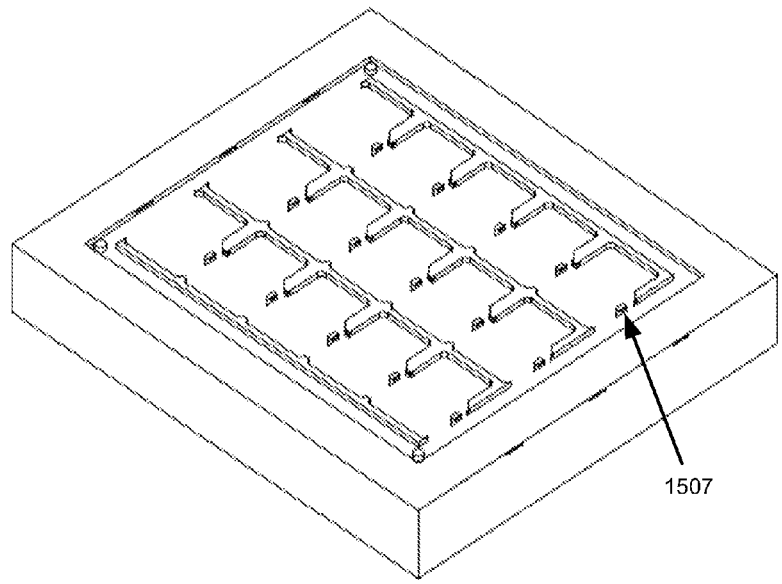

Referring back to FIG. 8, at block 350, an encapsulation process, also referred to as a molding process, is performed. Encapsulation (molding) process is a main part of package formation of the manufacturing process method herein. After the wire bonding process has been completed, the next process is to place the sub assembled panel as shown in FIGS. 14A-14C into a bottom piece molding block as shown in FIGS. 15A-15C. Bottom piece molding block includes an outer rim 1501, which is the highest surface of the block. The molding block further includes a block cavity edge 1502 which has a slightly larger outline than the PCB substrate panel of FIG. 14A. The molding block further includes a cavity 1503 depth defining a package thickness of the micro flash memory card.

Cylindrical poles 1504 have the same height or less than the thickness of the PCBA of micro flash memory card. All three poles are used to align and hold the PCB substrate panel in place through the Index and alignment holes 903 of FIG. 9A. There are multiple run gates 1505 designed for molding compound to inject into the cavity from external of mold block. Multiple ribs 1506 protruded from the cavity floor to the same height level as the top surface of the mold block allow the punched out region of the PCB to snug fit into these ribs to define the outer boundaries of the flash memory card.

In another embodiment as shown in FIG. 15C, there are notch-poles 1507 to define the notch at one side of the microSD card. FIG. 15B shows the cross sectional view looking from 15H-15H'plane of the bottom piece molding block.

Figure 16A:
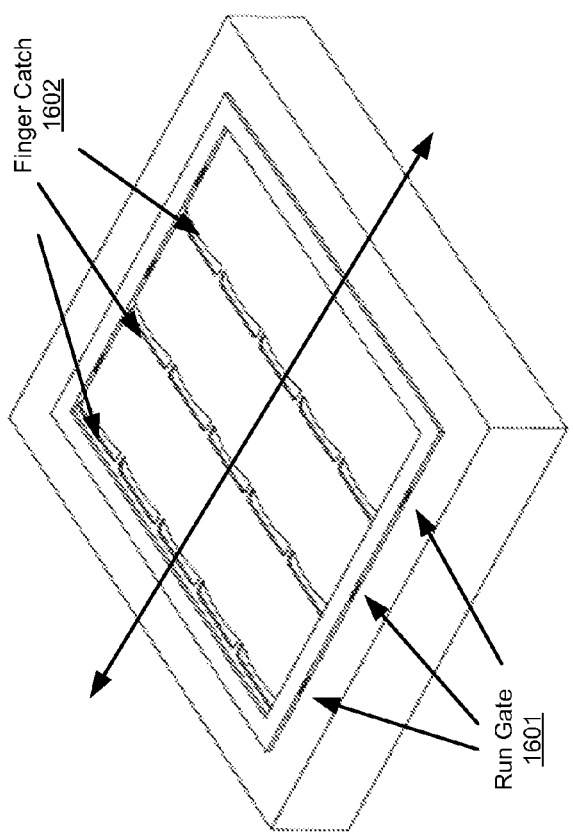
FIGS. 16A-16B show a molding block in different views as part of a molding process according to an alternative embodiment of the invention.
Figure 16B:
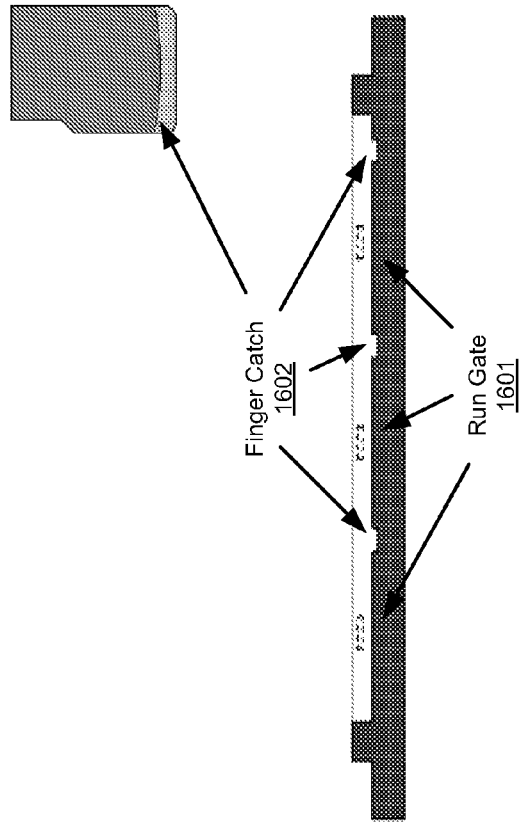

FIGS. 16A-16B show a top piece of a molding block in a perspective view and a cross-section view according to one embodiment. Referring to FIG. 16A, top piece molding block includes run gates 1601 designed to mate with run gates of top molding block's run gates 1601 to pipe in the injected molding compound. The "finger nail" catch 1602 provides a step height for finger to dig it out from the host device.

Figure 18A:
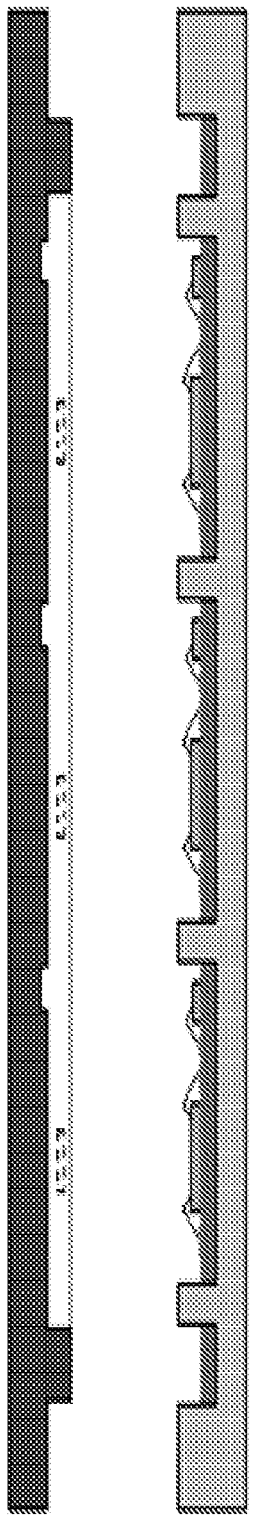
Figure 18B:
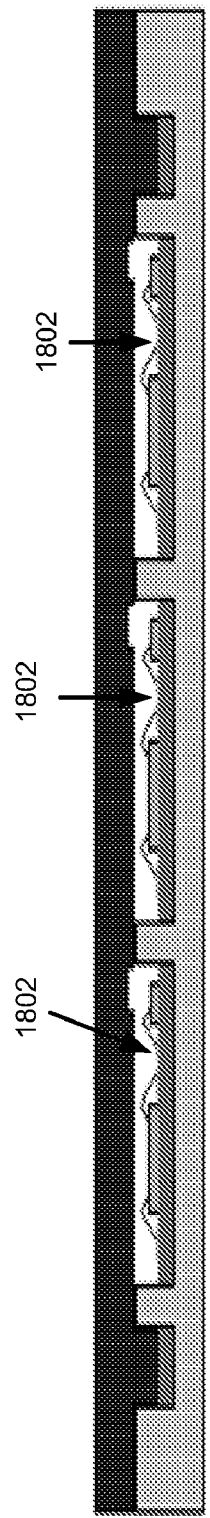

FIG. 17A shows the assembled PCBA panel 1702 loaded into the bottom mold block 1701. The ribs 1703 are fitted snugly into the pre-punched out slots on the PCB. FIG. 17B shows a cross-sectional view of assembled PCB panel loaded into the bottom mold block. According to one embodiment of the invention, a transfer mold machine is used to encapsulate all the components and the void area 1802 of all the micro flash memory card modules of the panel by lowering the top mold block onto the bottom mold block as shown in FIG. 18A. FIG. 18B shows the top and bottom mold blocks engaged in contact and closed position. Transfer molding is preferred here due to a high accuracy of transfer molding tooling and short cycle time of process. The molding material in the form of pellet is preheated and loaded into the pot (chamber).

Figure 19A:
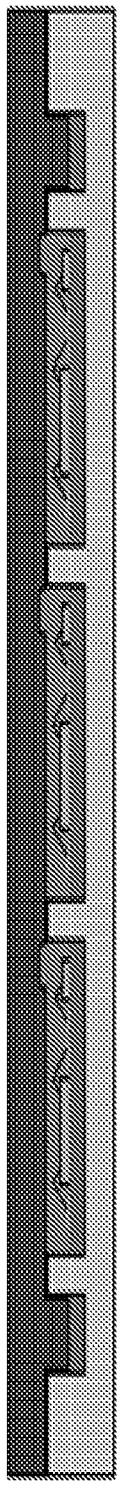
FIGS. 19A-19C and 20A-20B show a PCB panel in different views as part of a molding process according to one embodiment of the invention.
Figure 19B:
Figure 19C:
Figure 20B:
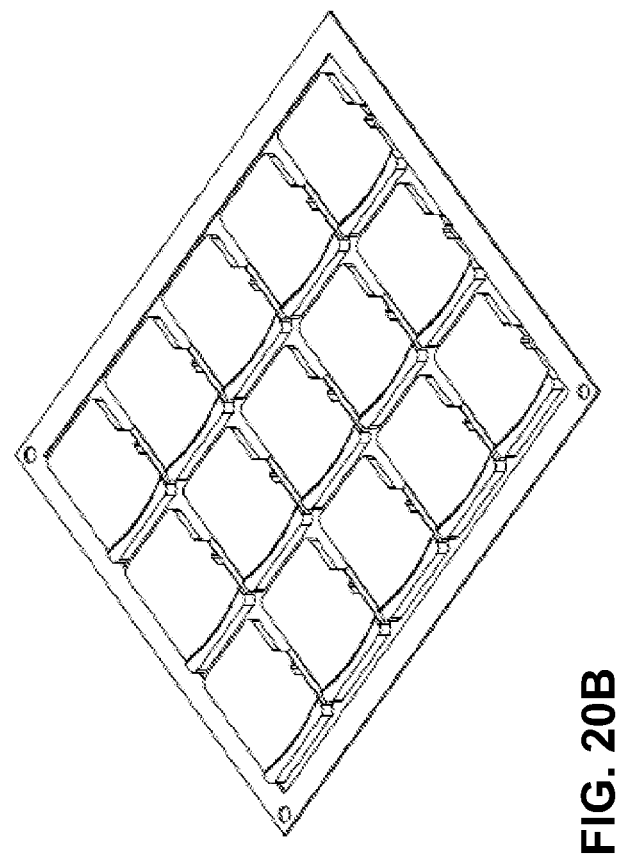
Figure 20A:
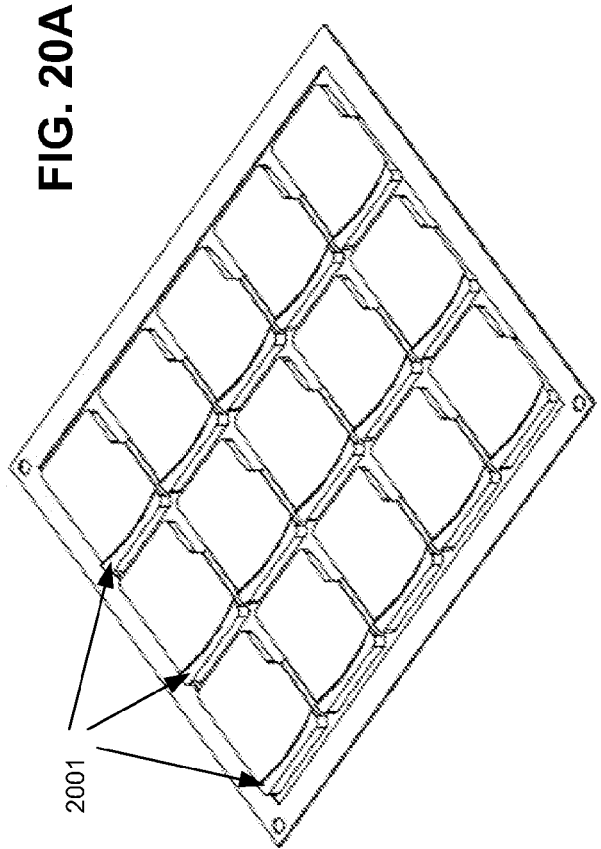

A screw drive push system is then used to force the material from the pot through channels known as a spruce and runner system into the mold cavities 1802. The mold remains closed as the material is inserted and filled up all vacant in the cavities. FIG. 19A shows the cavity of mold filled with plastic resin materials (dark grey). During the process, the mold walls are heated to a temperature above the melting point of the mold material, this allows a faster flow of material through the cavities. The molds in transfer molding remain closed until the curing reaction within the material is complete. A cooling down cycle followed and the molded materials started to solidify and harden. Ejector pins push the whole molded panel block from the mold once it has hardened. Cross sectional views of the completed micro flash memory cards are shown in FIG. 19B with single level MLC flash die and FIG. 19C shows multi-level stacked MLC flash dies product. A full panel of five rows by three columns of molded flash memory card is produced as shown in FIG. 20A with protruded finger catches 2001 visible from the molded surface. FIG. 20B shows alternative embodiment of molded micro-SD cards which used bottom mold block as described in FIG. 15C.

Figure 21:
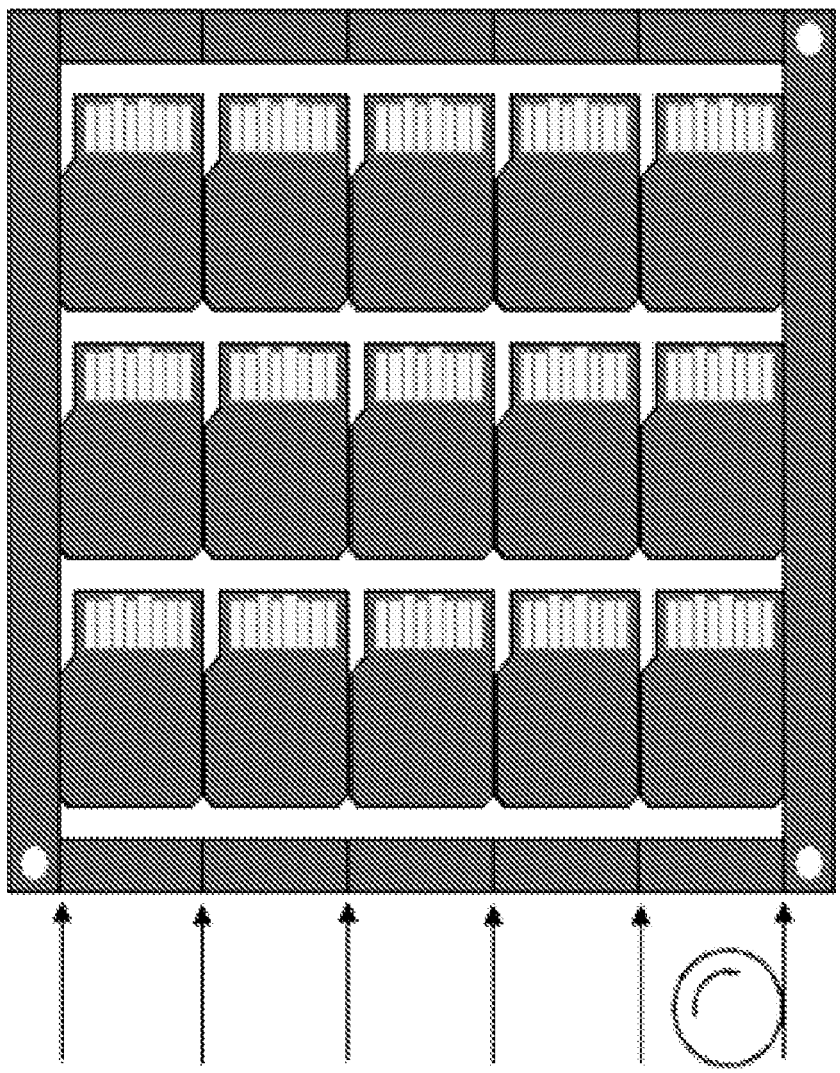
FIG. 21 shows a PCB panel as part of a singulation process according to one embodiment of the invention.

Referring back to FIG. 8, at block 360, a singulation process is performed. According to one embodiment, the entire PCBA is taped on a holder before loading onto the singulation machine. Singulation of the molded PCBA panel is performed using a disc saw to cut along the arrows pointed cut lines as shown in FIG. 21A. After cutting individual micro flash memory cards are peeled off from the tape.

Figure 22A:
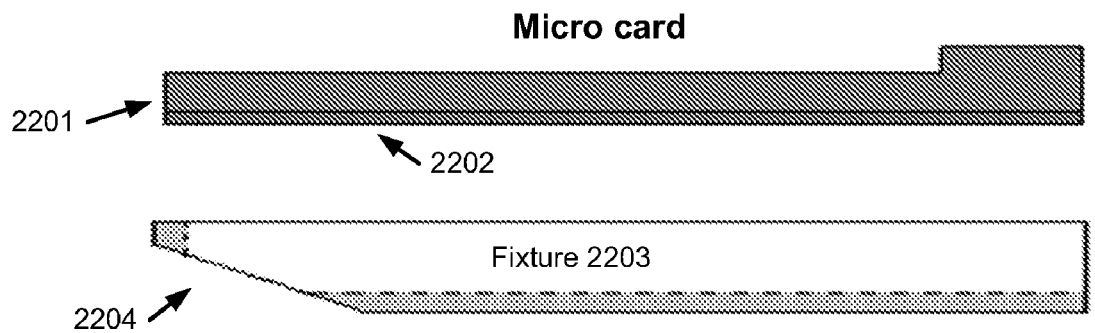
FIGS. 22A-22C show a front edge chamfer process according to one embodiment of the invention.
Figure 22B:
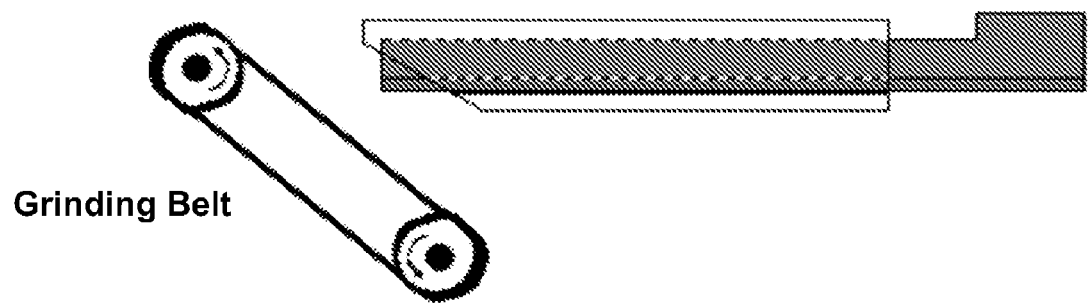
Figure 22C:
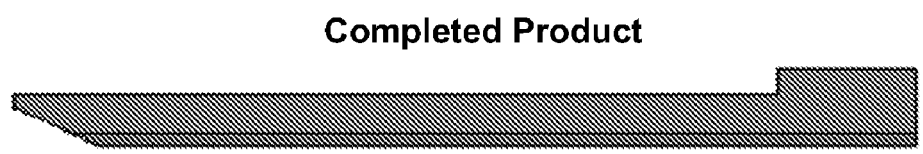

Referring back to FIG. 8, at block 365, a front edge chamfer process is performed. The front edge of the micro flash memory card requires chamfer process to make a 45° angle from front edge 2201 and top surface 2202 as shown in FIG. 22A. This chamfer facilitates smooth entry into host device. A custom built fixture 2203 is designed with an opening 2204 such that when the micro flash memory card is loaded as shown in FIG. 22B, the chamfer part of the front edge of the card is exposed for grinding off. A grinding belt or grinder is used to grind off the exposed part of the card. Completed micro flash memory card in FIG. 22C.

Figure 23A:
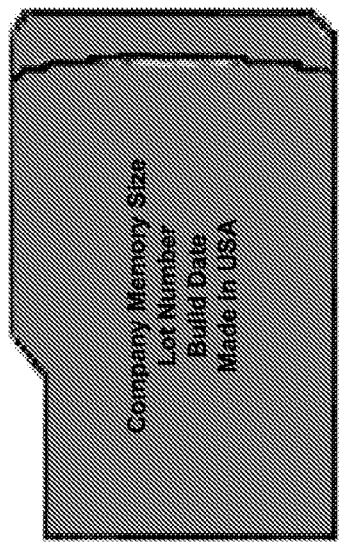
FIGS. 23A-23B show a micro card having a marking process according to one embodiment of the invention.
Figure 23B:
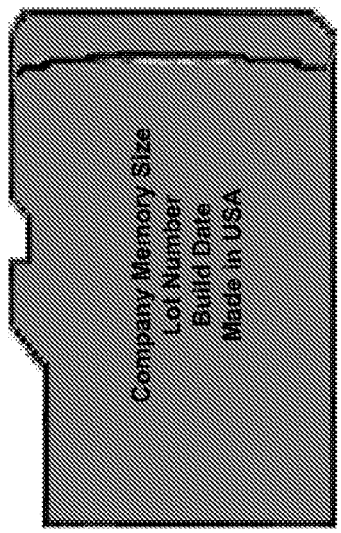

Referring back to FIG. 8, at block 370, a marking process is performed. The singulated and completed micro flash memory cards are now under go marking process where company's logo, micro card logo, RoHs logo, speed value, density value, or other related information that the manufacturers choose to print it on. FIG. 23A shows an example of the bottom side of a post Marking Process memory card. FIG. 23B shows another example of alternative embodiment of micro-SD card. After marking, the micro flash memory cards are placed in the baking oven to cure the permanent ink.

Referring back to FIG. 8, at block 380, test, pack, and ship processes are performed. The marked memory cards are then subjected to visual inspection and electrical tests. Visually and/or electrically test rejects are removed from the good population as defective rejects. The good memory cards are then packed into custom made boxes which are specified by customers. The final packed products will ship out to customers following correct procedures with necessary documents.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the size of the data area of a page has been shown to hold four sectors of 512-data, a page holds other number of sectors such as eight may be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of fabricating micro flash memory cards using a combination of both surface mount technology (SMT) process and chip-on-board (COB) process, the method comprising:

providing a PCB (printed circuit board) substrate;

mounting and wire bonding a plurality of electrical components of a plurality of micro flash memory cards to the PCB substrate to form a PCB panel having the plurality of micro flash memory cards thereon;

molding a card body over the PCB panel to encapsulate the plurality of electrical components of each micro flash memory card in a thermal set plastic compound, wherein the molded PCB panel are designed such that only horizontal cuts are required to separate each micro flash memory card from the PCB panel followed by marking and testing to obtain final products of the micro flash memory cards;

providing the PCB panel having a plurality of individual micro flash memory substrate boards;

punching out a plurality of slots on the PCB panel corresponding a plurality ribs of a bottom pierce of a molding block respective;

placing a plurality of metal contacts on a top surface of each individual micro flash memory substrate board for a purpose of carrying power supply source and data signals;

mounting a plurality of passive components including a resistor and a capacitor on a bottom surface of each individual micro flash memory substrate board using a STM process;

attaching a plurality of active components including a controller chip and a flash memory chip on a designated location on each individual micro flash memory substrate board;

performing a wire bonding process from die pads to PCB fingers to establish electrical connections from chip to chip and chip to passive components via traces on the bottom surface of each individual micro flash memory substrate, wherein all electronic components are attached on the bottom surface of each individual micro flash memory substrate;

performing a transfer and injection molding process for encapsulating the electronic components on the bottom surface of the individual micro flash memory substrates, exposing the top surface with the plurality of metal contacts to make physical contacts with metal pads on a female micro flash memory card socket when inserted;

performing an encapsulation and outline forming process using a molding technique; and performing a singulation process using a disc cut to separate individual micro flash memory cards from the PCB panel.

2. The method of claim 1, wherein the plurality of micro flash memory substrates on the PCB panel enables a high throughput in the SMT process and the COB process.

3. The method of claim 1, wherein the bottom pierce of the molding block includes a flat cavity floor with poles at three of a four corners to allow three index and alignment holes to fit in and hold in a precise position.

4. The method of claim 3, wherein bottom pierce of the molding block further includes a plurality of ribs to fit into the corresponding slots of the PCB panel.

5. The method of claim 3, wherein a depth of the bottom piece of the molding block defines a thickness of micro flash memory cards generated from the individual micro flash memory substrate boards.

6. The method of claim 1, wherein a top piece of the molding block includes one set of run gates for each column of the micro flash memory cards.

7. The method of claim 6, wherein the top piece of the molding block further includes an array of engraved depressions that define a shape and dimension of finger nail catch of each micro flash memory card.

8. The method of claim 1, wherein the singulation process is performed using the disc saw straight cut to singulate a molded micro flash memory cards array block.

9. The method of claim 8, further comprising chamfering off a front edge using a fixture and a grinding belt with fine abrading particles or grinder with disc grind stone to generate a finished piece.

* * * * *